United States Patent
Nitta et al.

(10) Patent No.: US 9,328,877 B2
(45) Date of Patent: May 3, 2016

(54) PHOSPHOR, LIGHT-EMITTING DEVICE, IMAGE PICKUP DEVICE, LIQUID CRYSTAL DISPLAY DEVICE, LIGHTING DEVICE, AND VEHICLE

(71) Applicant: PANASONIC CORPORATION, Osaka (JP)

(72) Inventors: Mitsuru Nitta, Osaka (JP); Seigo Shiraishi, Osaka (JP); Osamu Inoue, Osaka (JP); Kojiro Okuyama, Nara (JP); Yoshihisa Nagasaki, Osaka (JP); Takashi Ohbayashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 95 days.

(21) Appl. No.: 14/299,680

(22) Filed: Jun. 9, 2014

(65) Prior Publication Data

US 2014/0285997 A1   Sep. 25, 2014

Related U.S. Application Data

(63) Continuation of application No. PCT/JP2013/006002, filed on Oct. 8, 2013.

(30) Foreign Application Priority Data

Nov. 20, 2012   (JP) .................................. 2012-254516

(51) Int. Cl.
   C09K 11/08     (2006.01)
   H01L 33/00     (2010.01)
   (Continued)

(52) U.S. Cl.
   CPC ................. *F21K 9/56* (2013.01); *C09K 11/592* (2013.01); *C09K 11/7729* (2013.01);
   (Continued)

(58) Field of Classification Search
   CPC ... C09K 11/7734; H01L 33/502; F21S 48/10; F21S 48/1136; F21S 48/115; F21S 48/13; G03B 17/00; G03B 19/00; G02F 1/133609; G02F 1/133615; G02F 2001/133614
   See application file for complete search history.

(56) References Cited

U.S. PATENT DOCUMENTS 3,544,482 A   12/1970   Barry
7,786,659 B2   8/2010   Oaku et al.
(Continued)

FOREIGN PATENT DOCUMENTS

| CN | 1702809 A | 11/2005 |
|---|---|---|
| CN | 101175833 A | 5/2008 |
| CN | 101955772 A | 1/2011 |
| JP | 2009-059608 A | 3/2009 |
| JP | 2009-238887 A | 10/2009 |
| JP | 2009-252472 A | 10/2009 |
| JP | 2009-280793 A | 12/2009 |
| JP | 2010-006850 A | 1/2010 |
| WO | 2008-078711 A1 | 7/2008 |

OTHER PUBLICATIONS

International Search Report issued in PCT/JP2013/006002, dated Dec. 17, 2013, with English translation.
(Continued)

*Primary Examiner* — Carol M Koslow
(74) *Attorney, Agent, or Firm* — McDermot Will & Emery LLP

(57) ABSTRACT

The present disclosure provides a $(Ba_{1-z},Sr_z)_3MgSi_2O_8:Eu^{2+}$ based phosphor with high emission quantum efficiency. Specifically, the present disclosure provides a blue light emitting phosphor including: a $(Ba_{1-z},Sr_z)_3MgSi_2O_8$ based crystal where z satisfies $0 \leq z < 1$ and a $(Ba_{1-z},Sr_z)MgSiO_4$ based crystal where z satisfies $0 \leq z < 1$ as a host crystal; and $Eu^{2+}$ as a luminescent center.

16 Claims, 11 Drawing Sheets

(51) Int. Cl.
*F21K 99/00* (2016.01)
*F21V 9/08* (2006.01)
*G02B 6/00* (2006.01)
*C09K 11/77* (2006.01)
*C09K 11/59* (2006.01)
*F21S 8/10* (2006.01)
*G03B 17/00* (2006.01)
*G03B 19/00* (2006.01)
*G02F 1/1335* (2006.01)
*H01L 33/50* (2010.01)

(52) U.S. Cl.
CPC ........ *C09K 11/7731* (2013.01); *C09K 11/7734* (2013.01); *C09K 11/7774* (2013.01); *C09K 11/7789* (2013.01); *F21S 48/1225* (2013.01); *F21V 9/08* (2013.01); *G02B 6/00* (2013.01); *G02F 1/133609* (2013.01); *F21S 48/10* (2013.01); *F21S 48/115* (2013.01); *F21S 48/1136* (2013.01); *F21S 48/13* (2013.01); *G02F 1/133615* (2013.01); *G02F 2001/133614* (2013.01); *G03B 17/00* (2013.01); *G03B 19/00* (2013.01); *H01L 33/502* (2013.01); *H01L 33/504* (2013.01); *H01L 2224/48091* (2013.01); *H01L 2224/73265* (2013.01)

(56) References Cited

U.S. PATENT DOCUMENTS

2005/0264161 A1 12/2005 Oaku et al.
2009/0315448 A1 12/2009 Kuze et al.
2010/0214763 A1* 8/2010 Katou ................ C90K 11/7734
362/84

OTHER PUBLICATIONS

Chinese Search Report issued in Chinese Application No. 201380005296.X, dated Feb. 16, 2015, with English translation.
Chinese Search Report issued in Chinese Application No. 201380005296.X dated Sep. 15, 2015, with English Translation.
Yonesaki, Y. et al., "Crystal structure of Eu2+—doped M3MgSi2O8 (M: Ba, Sr, Ca) compounds and their emission properties", Journal of Solid State Chemistry, 182, (2009), 547-554.
Iwata, T. et al., "Reinvestigation of crystal structure and structural disorder of Ba3MgSi2O8", Powder Diffraction, 24 (3), (2009), 180-184.
Kim, J.S. et al., "Luminescent and thermal properties of full-color emitting X3MgSi2O8:Eu2+, Mn2+ (X=Ba, Sr, Ca) phosphors for white LED", Journal of Luminescence, 122-123, (2007), 583-586.

* cited by examiner

PHOSPHOR, LIGHT-EMITTING DEVICE, IMAGE PICKUP DEVICE, LIQUID CRYSTAL DISPLAY DEVICE, LIGHTING DEVICE, AND VEHICLE

This is a continuation of International Application No. PCT/JP2013/006002, with an international filing date of Oct. 8, 2013, which claims the foreign priority of Japanese Patent Application No. 2012-254516, filed on Nov. 20, 2012, the entire contents of both of which are hereby incorporated by reference.

BACKGROUND

1. Technical Field

The present disclosure relates to a phosphor and a light-emitting device including the phosphor. The present disclosure also relates to an image pickup device, a liquid crystal display device, and a lighting device, each including the light-emitting device. The present disclosure further relates to a vehicle including the lighting device serving as a vehicle lighting device.

2. Description of Related Art

From the viewpoint of energy saving, white LEDs (light-emitting diodes) have been widely used in recent years.

At present, commonly available white LEDs have a configuration in which a blue light-emitting element (blue LED chip) and a phosphor are combined. In such a commonly available white LED, a portion of blue light emitted from a blue LED chip is color-converted with a phosphor so that the blue light emitted from the blue LED chip and the light emitted from the phosphor are mixed to produce white light.

At present, combinations of blue LED chips and yellow phosphors are dominant in white LEDs. However, combinations of LEDs that emit light in the blue to near-ultraviolet region and three types of phosphors, i.e., blue phosphors, green phosphors, and red phosphors have been studied to develop white LEDs with higher color rendering properties and higher color reproducibility.

More recently, combinations of laser diodes (LDs) and blue, green and red phosphors have also been studied to develop high-power white light emitting devices.

Blue phosphors represented by the general formula: $M_3MgSi_2O_8:Eu^{2+}$ (where M is at least one element selected from Ca, Sr, and Ba) are conventionally known. However, these blue phosphors have the drawback of low emission quantum efficiency. In order to overcome this drawback, JP 2009-280793 A discloses, as a phosphor with improved quantum efficiency, a phosphor containing an Eu-containing $M^1_3MgSi_2O_8$ based crystal (where $M^1$ is Sr and Ba) as a main crystal and a $M^1_2MgSi_2O_7$ based crystal which is known as a crystal capable of emitting cyan light. However, the quantum efficiency of the phosphor disclosed in JP 2009-280793 A is still lower than required.

SUMMARY

One non-limiting and exemplary embodiment provides a $(Ba_{1-z},Sr_z)_3MgSi_2O_8:Eu^{2+}$ based phosphor with increased emission quantum efficiency.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a blue light emitting phosphor including: a $(Ba_{1-z},Sr_z)_3MgSi_2O_8$ based crystal where z satisfies $0 \leq z < 1$ and a $(Ba_{1-z},Sr_z)MgSiO_4$ based crystal where z satisfies $0 \leq z < 1$ as a host crystal; and $Eu^{2+}$ as a luminescent center.

It should be noted that general or specific embodiments may be implemented as a device, a system, a method, or any elective combination thereof.

According to the phosphor of the present disclosure, it is possible to increase the emission quantum efficiency of a $(Ba_{1-z},Sr_z)_3MgSi_2O_8:Eu^{2+}$ based phosphor.

DETAILED DESCRIPTION

Figure 1:
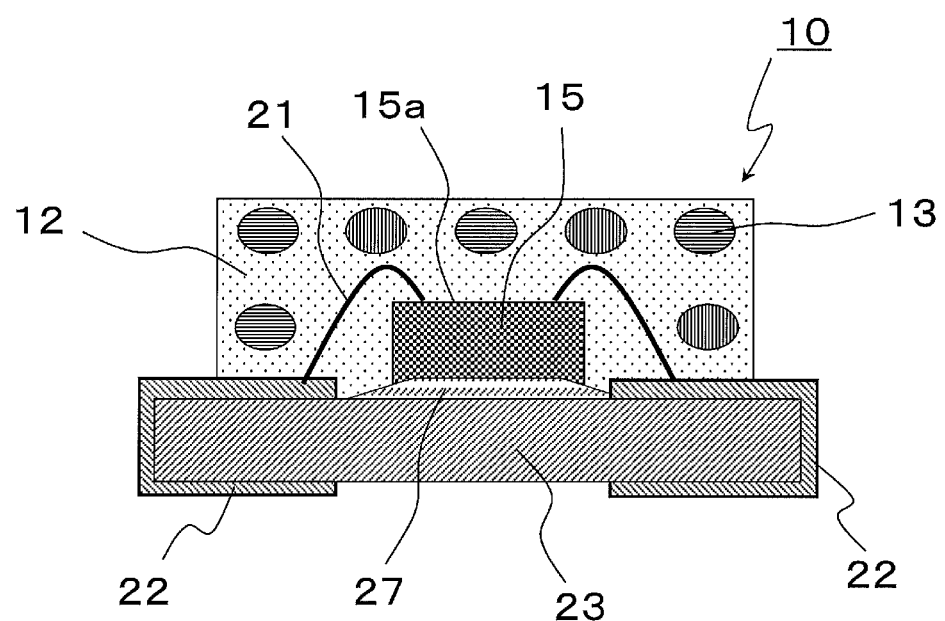
FIG. 1 is a schematic cross-sectional view of an LED device according to a second embodiment of the present disclosure.

Hereinafter, the present disclosure is described in detail with reference to particular embodiments. However, it should be understood that the present disclosure is not limited to these embodiments, and may be modified in various ways without departing from the technical scope of the present disclosure.

One embodiment of the present disclosure is a blue light emitting phosphor including: a $(Ba_{1-z},Sr_z)_3MgSi_2O_8$ based crystal where z satisfies $0\leq z<1$ and a $(Ba_{1-z},Sr_z)MgSiO_4$ based crystal where z satisfies $0\leq z<1$ as a host crystal; and $Eu^{2+}$ as a luminescent center.

In one aspect of this embodiment, in an X-ray diffraction pattern of the phosphor measured with Cu-Kα radiation, the phosphor has diffraction peaks at $2\theta=22°$ or more and 23° or less, at $2\theta=30.6°$ or more and 31.7° or less, and at $2\theta=31.8°$ or more and 32.8° or less, and diffraction peaks at $2\theta=28°$ or more and 30.4° or less and at $2\theta=34°$ or more and 35.5° or less.

In one aspect of this embodiment, in an X-ray diffraction pattern of the phosphor measured with Cu-Kα radiation, a ratio "a" satisfies a=c/b and $0.01\leq a\leq 0.18$, the ratio "a" being a ratio of an intensity "c" to an intensity "b", in which the intensity "c" is a highest diffraction peak in a range of $2\theta=34°$ or more and 35.5° or less derived from the $(Ba_{1-z},Sr_z)MgSiO_4$ based crystal, and the intensity "b" is a highest diffraction peak intensity in a range of $2\theta=31.8°$ or more and 32.8° or less derived from the $(Ba_{1-z},Sr_z)_3MgSi_2O_8$ based crystal.

In one aspect of this embodiment, the host crystal of the phosphor has a composition represented by the general formula: $(Ba_{1-z},Sr_z)_{3+j}Mg_{1+k}Si_{2+m}O_{8+n}$ (where j, k, m, n and z satisfy $0<j\leq 1.0$, $0<k\leq 1.0$, $0<m\leq 1.0$, $0<n\leq 4.0$, and $0\leq z\leq 0.4$).

In one aspect of this embodiment, the phosphor has a Eu content of less than 2.0 at. % of a total of Eu, Ba, and Sr.

In one aspect of this embodiment, the phosphor has a Eu content of 0.6 at. % or more of a total of Eu, Ba, and Sr.

Another embodiment of the present disclosure is a light-emitting device including: the phosphor; and a light-emitting element.

In one aspect of this embodiment, the light-emitting element is a laser diode. In this aspect, the laser diode has a laser energy density of 0.5 kW/cm² or more, for example.

In one aspect of this embodiment, the light-emitting element includes a light-emitting layer made of a nitride semiconductor having a nonpolar or semipolar growth plane.

Another embodiment of the present disclosure is an image pickup device including: a flashlight including the light-emitting device; and a lens on which light reflected from an object irradiated with light from the flashlight is incident.

Another embodiment of the present disclosure is a liquid crystal display device including a backlight including the light-emitting device.

Another embodiment of the present disclosure is a lighting device including a light source portion including the light-emitting device.

In one aspect of this embodiment, the lighting device is a vehicle lighting device.

Another embodiment of the present disclosure is a vehicle including the vehicle lighting device.

First Embodiment

The present embodiment is a blue light emitting phosphor including: a $(Ba_{1-z},Sr_z)_3MgSi_2O_8$ based crystal where z satisfies $0\leq z<1$ and a $(Ba_{1-z},Sr_z)MgSiO_4$ based crystal where z satisfies $0\leq z<1$ as a host crystal; and $Eu^{2+}$ as a luminescent center.

As a result of intensive studies, the present inventors have found that a $(Ba_{1-z},Sr_z)_3MgSi_2O_8:Eu^{2+}$ based phosphor including, as a host crystal, a mixed crystal of $(Ba_{1-z},Sr_z)_3MgSi_2O_8$ and $(Ba_{1-z},Sr_z)MgSiO_4$ (which means that a $(Ba_{1-z},Sr_z)_3MgSi_2O_8$ based crystal phase and a $(Ba_{1-z},Sr_z)MgSiO_4$ based crystal phase are present in each particle of the phosphor) allows the $(Ba_{1-z},Sr_z)_3MgSi_2O_8$ based crystal to have higher emission quantum efficiency than a $(Ba_{1-z},Sr_z)_3MgSi_2O_8:Eu^{2+}$ based phosphor including, as a host crystal, a single $(Ba_{1-z},Sr_z)_3MgSi_2O_8$ based crystal phase.

The presence of two types of crystals, i.e., a $(Ba_{1-z},Sr_z)_3MgSi_2O_8$ based crystal and a $(Ba_{1-z},Sr_z)MgSiO_4$ based crystal in a host crystal of a phosphor can be confirmed by measurement of the X-ray diffraction pattern of the phosphor, for example. The phosphor of the present embodiment has diffraction peaks at $2\theta=22°$ or more and 23° or less, at $2\theta=30.6°$ or more and 31.7° or less, and at $2\theta=31.8°$ or more and 32.8° or less, in an X-ray diffraction pattern measured with Cu-Kα radiation, for example. These diffraction peaks are derived from $(Ba_{1-z},Sr_z)_3MgSi_2O_8$. In addition, the phosphor of the present embodiment has diffraction peaks at $2\theta=28°$ or more and 30.4° or less and at $2\theta=34°$ or more and 35.5° or less. These diffraction peaks are derived from $(Ba_{1-z},Sr_z)MgSiO_4$.

The abundance ratio between the $(Ba_{1-z},Sr_z)_3MgSi_2O_8$ based crystal and the $(Ba_{1-z},Sr_z)MgSiO_4$ based crystal is not particularly limited. In one aspect, for example, in an X-ray diffraction pattern of the phosphor of the present embodiment measured with Cu-Kα radiation, a ratio "a" satisfies a=c/b and $0.01\leq a\leq 0.18$. The ratio "a" is a ratio of the intensity "c" to the intensity "b". The intensity "c" is the highest diffraction peak intensity in the range of $2\theta=34°$ or more and 35.5° or less derived from the $(Ba_{1-z},Sr_z)MgSiO_4$ based crystal, and the intensity "b" is the highest diffraction peak intensity in the range of $2\theta=31.8°$ or more and 32.8° or less derived from the $(Ba_{1-z},Sr_z)_3MgSi_2O_8$ based crystal. When the ratio "a" is in this range, the quantum efficiency is very high. When the ratio "a" is in a range of $0.03\leq a\leq 0.06$, the quantum efficiency is particularly high.

The composition of the host crystal of the phosphor is not particularly limited as long as the phosphor includes a $(Ba_{1-z},Sr_z)_3MgSi_2O_8$ based crystal and a $(Ba_{1-z},Sr_z)MgSiO_4$ based crystal. In one aspect, for example, the host crystal of the phosphor has a composition represented by the general formula: $(Ba_{1-z},Sr_z)_{3+j}Mg_{1+k}Si_{2+m}O_{8+n}$ (where j, k, m, n and z satisfy $0<j\leq 1.0$, $0<k\leq 1.0$, $0<m\leq 1.0$, $0<n\leq 4.0$, and $0\leq z\leq 0.4$). When the composition is in this range, the quantum efficiency is very high. In one aspect, for example, the host crystal of the phosphor has a composition represented by $(Ba_{1-z},Sr_z)_{3+j}Mg_{1+j}Si_{2+j}O_{8+4j}$ (where j and z satisfy $0<j\leq 1.0$ and $0\leq z\leq 0.4$).

The phosphor of the present embodiment includes $Eu^{2+}$ as a luminescent center and emits blue light. As used herein, "blue light emission" refers to emission of light having an emission peak at a wavelength of 420 nm or more and 480 nm or less.

The Eu content in the phosphor is not particularly limited as long as the phosphor can emit light. The Eu content is, for example, 0.1 at. % or more and 10 at. % or less of the total of Eu, Ba, and Sr. In the case where the energy density of excitation light is low, the quantum efficiency tends to increase as the Eu content increases. When the Eu content is more than 2.0 at. % of the total of Eu, Ba, and Sr, the quantum efficiency is particularly high. On the other hand, in the case where the energy density of excitation light is high (for example, when the energy density is 0.5 kW/cm² or more), when the Eu content is less than 2.0 at. % of the total of Eu, Ba, and Sr, the quantum efficiency can be increased more while the use of expensive Eu is reduced. The quantum efficiency is even higher when the Eu content is 1.8 at. % or less, and the quantum efficiency is particularly high when the Eu content is 1.6 at. % or less. On the other hand, when the Eu content is 0.6 at. % or more of the total of Eu, Ba, and Sr, the quantum efficiency can be increased more. The quantum efficiency is even higher when the Eu content is 0.8 at. % or more, and the quantum efficiency is particularly high when the Eu content is 1.0 at. % or more.

Next, an example of the method for producing the phosphor of the present embodiment is described.

Materials for use in the phosphor of the present embodiment are compounds that can be converted into oxides by firing, such as high-purity (purity of 99% or more) hydroxides, oxalates or nitrates, or high-purity (purity of 99% or more) oxides.

A small amount of fluoride (for example, calcium fluoride) or chloride (for example, calcium chloride) can be added to the materials to accelerate a reaction.

The production of the phosphor is performed by mixing the above materials and firing the resulting mixture. The materials in a solvent can be mixed by wet mixing, or the materials in the form of dry powders may be mixed by dry mixing. A ball mill, a stirred media mill, a planetary mill, a vibration mill, a jet mill, a V-type mixer, an agitator, and the like, which are commonly used in industrial applications, may be used.

When the materials are mixed, the mixing ratio of the materials is adjusted so that the composition is deviated from $(Ba_{1-z},Sr_z)_3MgSi_2O_8$ so as to produce a $(Ba_{1-z},Sr_z)_3MgSi_2O_8$ based crystal and a $(Ba_{1-z},Sr_z)MgSiO_4$ based crystal. These two types of crystal phases can be formed even if the composition of the host crystal is deviated from the composition of $(Ba_{1-z},Sr_z)_{3+j}Mg_{1+j}Si_{2+j}O_{8+4j}$. Therefore, as a simple method for obtaining the phosphor of the present embodiment, the mixing ratio of the materials is adjusted to obtain a composition represented by $(Ba_{1-z},Sr_z)_{3+j}Mg_{1+j}Si_{2+j}O_{8+4j}$ (where j and z satisfy $0<j\leq1.0$ and $0\leq z\leq0.4$) or a composition similar to the composition (for example, a composition represented by $(Ba_{1-z},Sr_z)_{3+j}Mg_{1+k}Si_{2+m}O_{8+n}$ where j, k, m, n and z satisfy $0<j\leq1.0$, $0<k\leq1.0$, $0<m\leq1.0$, $0<n\leq4.0$, and $0\leq z\leq0.4$). The mixing ratio of the materials is not particularly limited as long as the $(Ba_{1-z},Sr_z)_3MgSi_2O_8$ based crystal and the $(Ba_{1-z},Sr_z)MgSiO_4$ based crystal are produced.

The firing of the material mixture is performed in a reducing atmosphere (for example, a nitrogen/hydrogen mixed gas atmosphere) at temperatures ranging from 1100° C. to 1400° C. for about 1 to 50 hours.

Furnaces that are commonly used in industrial applications can be used for the firing. A gas furnace or an electric furnace of the batch type or continuous type such as a pusher furnace can be used.

The particle size distribution and flowability of the phosphor powder can be adjusted by pulverizing the obtained phosphor powder again using a ball mill, a jet mill, or the like, followed by washing or classifying it, if necessary.

The emission quantum efficiency of the $(Ba_{1-z},Sr_z)_3MgSi_2O_8$ based crystal in the phosphor of the present embodiment is higher than that in a $(Ba_{1-z},Sr_z)_3MgSi_2O_8:Eu^{2+}$ based phosphor including, as a host crystal, a single $(Ba_{1-z},Sr_z)_3MgSi_2O_8$ based crystal phase. Therefore, with the use of the phosphor of the present embodiment in a light-emitting device, the efficiency of the light-emitting device can be improved.

Second Embodiment

Hereinafter, as an example of a light-emitting device according to an embodiment of the present disclosure, an LED device including an LED chip as a light-emitting element serving as a light source is described.

FIG. 1 is a schematic cross-sectional view showing an embodiment of an LED device according to the present disclosure. As shown in FIG. 1, an LED device 10 includes a support 23, an LED chip 15, and an LED encapsulant 12.

The support 23 supports the LED chip 15. In the present embodiment, since the LED device 10 has a surface-mountable structure, the support 23 is a substrate. The present embodiment can be used in a high-brightness LED device. For example, the support 23 has a high thermal conductivity so as to efficiently dissipate heat generated in the LED chip 15 to the outside of the LED device. For example, a ceramic substrate made of alumina, aluminum nitride, or the like can be used as the support 23.

As the LED chip 15, for example, an LED chip that emits light in the near-ultraviolet to blue region is used. That is, an LED chip having an emission peak wavelength in a range of 380 nm or more and 425 nm or less is used. Specifically, a blue LED chip, a violet LED chip, a near-ultraviolet LED chip, or the like is used as the LED chip 15. The emission peak wavelength of the LED chip 15 may be, for example, in a range of 380 nm or more and 420 nm or less, or in a range of 380 nm or more and 410 nm or less, for efficient emission of the phosphor.

The LED chip 15 is fixed to the support 23 with solder 27 or the like so that a light-emitting surface 15a of the LED chip 15 on the support 23 faces upward. The LED chip 15 is electrically connected to electrodes 22 provided on the support by bonding wires 21.

The LED chip 15 is covered by the LED encapsulant 12, and a silicone resin is used as the LED encapsulant 12. The phosphor 13 particles are dispersed in the LED encapsulant 12.

For the silicone resin, silicone resins used as encapsulating resins for semiconductor light-emitting elements and having structures defined by various chemical formulae can be used. In particular, the silicone resin contains dimethyl silicone having high resistance to discoloration, for example. Methylphenyl silicone having high heat resistance can also be used as the silicone resin. The silicone resin may be a homopolymer having a main skeleton formed by a siloxane bond defined by a single chemical formula. The silicone resin may be a copolymer including a structural unit having a siloxane bond and defined by two or more chemical formulae, or an alloy of two or more silicone polymers. In this specification, the silicone resin in the LED encapsulant 12 is in a cured state. Therefore, the LED encapsulant 12 is also in a cured state. As will be described below, the LED encapsulant 12 can be prepared using an uncured silicone resin. A silicone resin is typically of a two-component type consisting of a base resin and a curing agent, which are mixed together to promote curing. However, a thermosetting silicone resin, or an energy-curable silicone resin, which cures by being irradiated with an energy such as light, can also be used as the silicone resin 12.

Materials other than silicone resins may be used for the LED encapsulant 12. For example, glasses, epoxy resins, etc. can be used. The phosphor 13 in the form of a phosphor plate may be placed on the LED encapsulant 12, instead of being dispersed in the LED encapsulant 12.

<Phosphor>

The phosphor 13 absorbs some or all of the wavelength components of light in the near-ultraviolet to blue region (for example, near-ultraviolet light) emitted from the LED chip 15 and emits fluorescence. The wavelength of the absorbed light and the wavelength of the emitted fluorescence depend on the types of fluorescent materials contained in the phosphor 13.

The phosphor 13 is a phosphor mixture containing a plurality of phosphors emitting different color lights, which are mixed to produce white light. In the present embodiment, the phosphor 13 is a phosphor mixture of a blue phosphor, a green phosphor, and a red phosphor.

The phosphor of the first embodiment described above is used as the blue phosphor.

Examples of the green phosphor that can be used include $M^a{}_2MgSi_2O_7:Eu^{2+}$ ($M^a$ is at least one selected from Ba, Sr, and Ca), $SrSi_5AlO_2N_7:Eu^{2+}$, $SrSi_2O_2N_2:Eu^{2+}$, $BaAl_2O_4:Eu^{2+}$, $BaZrSi_3O_9:Eu^{2+}$, $M^a{}_2SiO_4:Eu^{2+}$ ($M^a$ is at least one selected from Ba, Sr, and Ca), $BaSi_3O_4N_2:Eu^{2+}$, $Ca_8Mg(SiO_4)_4Cl_2:Eu^{2+}$, and β-SiAlON:$Eu^{2+}$.

Examples of the red phosphor that can be used include $CaAlSiN_3:Eu^{2+}$, $SrAlSi_4O_7:Eu^{2+}$, $M^a{}_2Si_5N_8:Eu^{2+}$ ($M^a$ is at least one selected from Ba, Sr, and Ca), $M^aSiN_2:Eu^{2+}$ ($M^a$ is at least one selected from Ba, Sr, and Ca), $M^b Si_2O_2N_2:Yb^{2+}$ ($M^b$ is at least one selected from Sr and Ca), $Y_2O_2S:Eu^{3+}$, $Sm^{3+}$, $La_2O_2S:Eu^{3+},Sm^{3+}$, $CaWO_4:Li^{1+},Eu^{3+},Sm^{3+}$, and $M^a{}_2SiS_4:Eu^{2+}$ ($M^a$ is at least one selected from Ba, Sr, and Ca).

In another aspect, the phosphor 13 may be a phosphor mixture of a blue phosphor and a yellow phosphor. In this case, the phosphor of the first embodiment described above is used as the blue phosphor. Examples of the yellow phosphor that can be used include $Y_3Al_5O_{12}:Ce^{3+}$, $CaSi_2O_2N_2:Eu^{2+}$, $Ca_3Sc_2Si_3O_{12}:Ce^{3+}$, $CaSc_2O_4:Ce^{3+}$, and α-SiAlON:$Eu^{2+}$.

The particle diameter of the phosphor 13 is, for example, 1 μm or more and 80 μm or less. In this specification, the particle diameter refers to a particle diameter in terms of a circle-equivalent diameter measured by microscopy. The content of the phosphor 13 in the LED encapsulant 12 is, for example, 3 parts by weight or more to 70 parts by weight or less per 100 parts by weight of the encapsulant. This is because if the content of the phosphor 13 is less than 3 parts by weight, sufficiently intense fluorescence cannot be obtained, which may make it difficult to obtain the LED device 10 capable of emitting light with a desired wavelength. The weight ratio of the different color emitting phosphors used in the phosphor 13 can be determined as appropriate depending on the color tone of the desired white light and the emission intensities of the respective phosphors.

It is also possible to configure the LED device as an LED device that emits a color other than white by using the phosphor of the first embodiment alone or in combination with other color phosphors.

The above-mentioned phosphors other than the blue phosphors can be produced according to known methods.

Specifically, materials for use in producing oxide phosphors are compounds that can be converted into oxides by firing, such as high-purity (purity of 99% or more) hydroxides, oxalates or nitrates, or high-purity (purity of 99% or more) oxides.

A small amount of fluoride (for example, calcium fluoride) or chloride (for example, calcium chloride) can be added to accelerate a reaction.

The production of the phosphor is performed by mixing the above materials and firing the resulting mixture. The materials in a solvent can be mixed by wet mixing, or the materials in the form of dry powders may be mixed by dry mixing. A ball mill, a stirred media mill, a planetary mill, a vibration mill, a jet mill, a V-type mixer, an agitator, and the like, which are commonly used in industrial applications, may be used.

The firing of the phosphor materials is performed in the air or a reducing atmosphere at temperatures ranging from 1100° C. to 1400° C. for about 1 to 50 hours.

Furnaces that are commonly used in industrial applications can be used for the firing. A gas furnace or an electric furnace of the batch type or continuous type such as a pusher furnace can be used.

The particle size distribution and flowability of the phosphor powder can be adjusted by pulverizing the obtained phosphor powder again using a ball mill, a jet mill, or the like, followed by washing or classifying it, if necessary.

<LED Chip>

In the example described above, the LED chip is wire-bonded, but the LED chip used in the present embodiment may be configured in other ways. That is, the LED chip used in the present embodiment may be face-up mounted or flip-chip mounted. Furthermore, the LED chip used in the present embodiment may include a light-emitting layer made of a nitride semiconductor having a typical polar growth plane (c-plane). The LED chip used in the present embodiment may include a light-emitting layer made of a nitride semiconductor having a nonpolar or semipolar growth plane (such as an m-plane, an -r-plane, a (20-21) plane, a (20-2-1) plane, a (10-1-3) plane, or a (11-22) plane). Since the LED chip having a nonpolar or semipolar growth plane is less affected by a piezoelectric field, it can emit light with a wavelength of 380 nm or more and 425 nm or less (in particular, a wavelength of 380 nm or more and 420 nm or less) efficiently. Hereinafter, an LED chip including a light-emitting layer made of a nitride semiconductor having an m-plane as a growth plane is described as an example.

Figure 5:
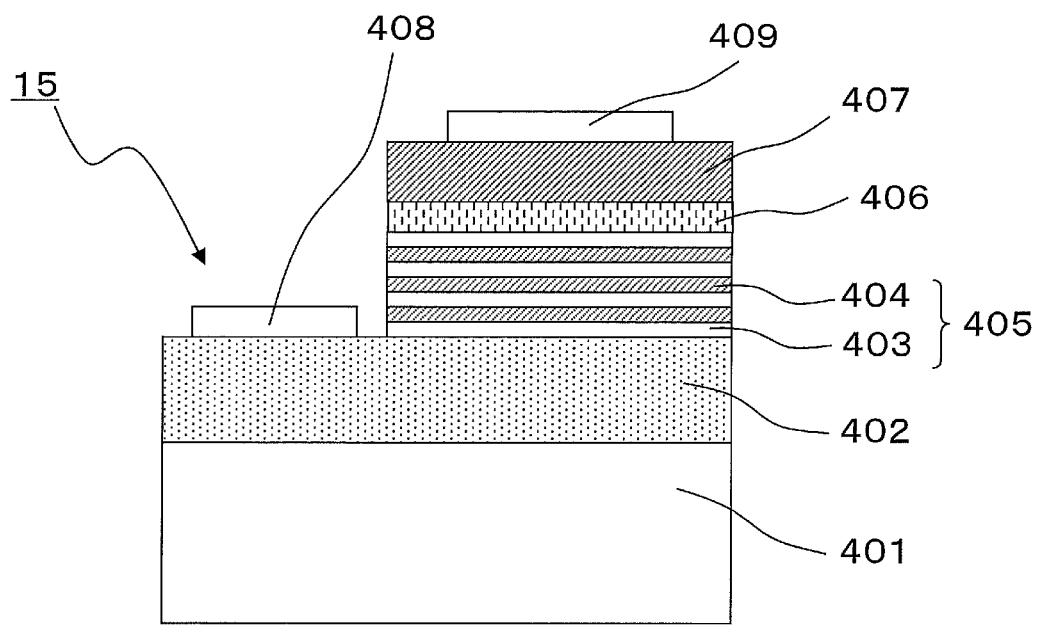
FIG. 5 is an explanatory diagram showing an example of a configuration of an LED chip.

FIG. 5 is an explanatory diagram showing an example of a configuration of an LED chip. The LED chip 15 used in the present embodiment includes a substrate 401, an n-type layer 402, a light-emitting layer 405, a p-type layer 407, an n-side electrode 408, and a p-side electrode 409. The substrate 401 is a GaN substrate having an m-plane principal surface. As the substrate 401, an m-plane SiC substrate having an m-plane GaN layer formed thereon, an r-plane sapphire substrate having an m-plane GaN layer formed thereon, or an m-plane sapphire substrate may be used. For example, the n-type layer 402 is provided on the substrate 401, and the light-emitting layer 405 is disposed between the n-type layer 402 and the p-type layer 407. An undoped layer 406 may be provided between the light-emitting layer 405 and the p-type layer 407. The n-type layer 402, the light-emitting layer 405, the undoped layer 406, and the p-type layer 407 are each, for example, a gallium nitride-based compound semiconductor layer having an m-plane growth plane. The n-type layer 402 is, for example, a Si-doped n-type $Al_sGa_tIn_uN$ (s, t and u satisfy $0 \leq s, t, u \leq 1$ and s+t+u=1) layer. The light-emitting layer 405 is, for example, a multiple quantum well active layer having a plurality of GaN barrier layers 403 and a plurality of InGaN well layers 404. The light-emitting layer 405 may be a single quantum well active layer having two GaN barrier layers 403 and one InGaN well layer 404 sandwiched therebetween. The p-type layer 407 is, for example, a Mg-doped p-type $Al_vGa_wIn_xN$ (v, w and x satisfy $0 \leq v, w, x \leq 1$ and v+w+x=1) layer. The n-side electrode 408 is provided in contact with the n-type layer 402. The p-side electrode 409 is provided in contact with the p-type layer 407.

In this specification, the "m-plane" includes any plane inclined in a given direction within a range of ±5° from an m-plane (i.e., an m-plane with no inclination) or any plane having a plurality of stepped m-plane regions. The inclination angle is defined by the angle between the normal line of the growth plane of the light-emitting layer 405 and the normal line of the m-plane thereof. The absolute value of the inclination angle θ may be 5° or less or 1° or less in the c-axis direction. The absolute value of the inclination angle θ may be 5° or less or 1° or less in the a-axis direction. Even if the growth plane is inclined at such a small angle, a decrease in the internal quantum efficiency due to the piezoelectric field can be reduced sufficiently. When the growth plane is slightly inclined from the m-plane, the entire growth plane seems to be inclined from the m-plane, but upon closer observation, the growth plane is composed of a plurality of m-plane regions formed in a stepped manner. Each step has a height equivalent to one to several atomic layer thickness. Therefore, it is presumed that a nitride semiconductor having, as a growth plane, a plane inclined at an angle of 5° or less, in terms of the absolute value, from the m-plane or a plane composed of a plurality of m-plane steps has the same properties as a nitride semiconductor having a growth m-plane with no inclination.

Next, an example of a method for producing the LED chip used in the present embodiment is described. First, before a nitride semiconductor is grown, the substrate 401 is washed with a buffered hydrofluoric acid (BHF) solution, rinsed with water thoroughly, and then dried. After the substrate 401 is washed, it is placed in a reaction chamber of an MOCVD system while minimizing exposure to air. Then, the substrate is heated to about 850° C., with gases such as ammonia ($NH_3$), nitrogen, and hydrogen introduced into the chamber, so as to clean the surface of the substrate.

A gallium nitride-based compound semiconductor layer is grown by, for example, the MOCVD (Metal Organic Chemical Vapor Deposition) method. Trimethylgallium (TMG) or triethylgallium (TEG) and further silane ($SiH_4$) are supplied, and the substrate 401 is heated to about 1100° C. to deposit the n-type layer 402. Silane is a source gas of Si as an n-type dopant. Next, the supply of the $SiH_4$ gas is stopped and the temperature of the substrate is lowered to less than 800° C. to deposit the GaN barrier layer 403. Then, the supply of trimethylindium (TMI) is started to deposit an InGaN well layer 404. At least two cycles of alternate deposition of the GaN barrier layers 403 and the InGaN well layers 404 are repeated so as to form the light-emitting layer 405. At least two cycles of alternate deposition makes it possible to prevent the density of carriers in the well layers from increasing excessively even at high current driving and to reduce the number of overflowing carriers. The growth time for the InGaN well layer 404 may be adjusted so that the InGaN well layer 404 with a thickness of 3 nm or more and 20 nm or less can be deposited. Furthermore, the well layer with a thickness of 6 nm or more can also be deposited because the influence of the piezoelectric field can be reduced by the growth of the m-plane. Thereby, the droop of the emission efficiency can be reduced. The thickness of 20 nm or less makes it possible to form the uniform InGaN well layer. Furthermore, the growth time for the GaN barrier layer 403 may be adjusted so that the GaN barrier layer 403 with a thickness of 6 nm or more and 40 nm or less can be deposited. The thickness of 6 nm or more makes it possible to form a barrier to the InGaN well layer 404 more reliably. The thickness of 40 nm or less makes it possible to reduce the operating voltage. Adjustment of the In content in the InGaN well layer 404 makes it possible to obtain light with a desired emission wavelength of 380 nm or more and 425 nm or less.

Next, for example, an undoped GaN layer with a thickness of 30 nm is deposited as the undoped layer 406 on the light-emitting layer 405. Then, the p-type layer 407 is formed on the undoped layer 406. The p-type layer 407 is formed by supplying TMG, $NH_3$, TMA, TMI, and $Cp_2Mg$ (cyclopentadienyl magnesium) as a p-type impurity source. The p-type layer 407 is composed of, for example, a p-$Al_{0.14}Ga_{0.86}N$ layer with a thickness of about 50 nm and a p-GaN layer with a thickness of 100 nm. The upper part of the p-type layer 407 may be a contact layer with an increased concentration of Mg.

Then, portions of the p-type layer 407, the undoped layer 406, the active layers 405, and the n-type layer 402 are removed by chlorine-based dry etching so as to form a recess and expose a portion of the n-type layer 402. Next, the n-side electrode 408 is formed at the bottom of the recess. Then, the p-side electrode 409 is formed on the p-type layer 407.

<Production Method of LED Device>

Next, an example of a method for producing the LED device 10 is described below, but the LED device 10 is not limited to what is fabricated by the following production method.

An uncured LED encapsulating resin mixture is prepared by dispersing the phosphor 13 particles in an uncured silicone resin. In the case where the silicone resin used is a type of resin that is cured by mixing two liquid components together, the uncured silicone resin contains a liquid component A and a liquid component B.

Figure 2A:
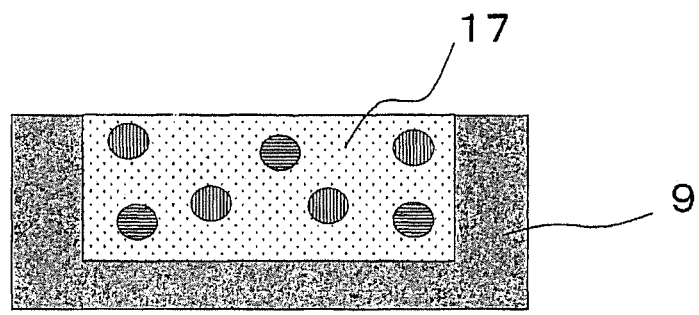
FIGS. 2A to 2D are diagrams showing steps of a production process of the LED device shown in FIG. 1.
Figure 2B:
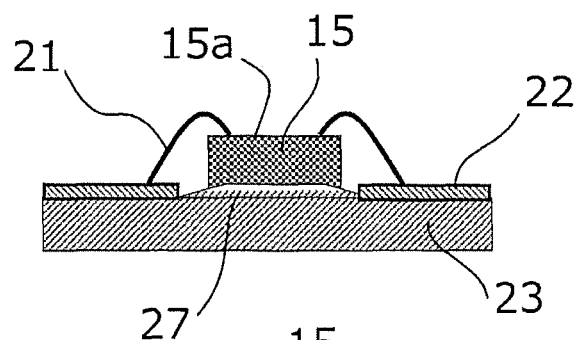
Figure 2C:
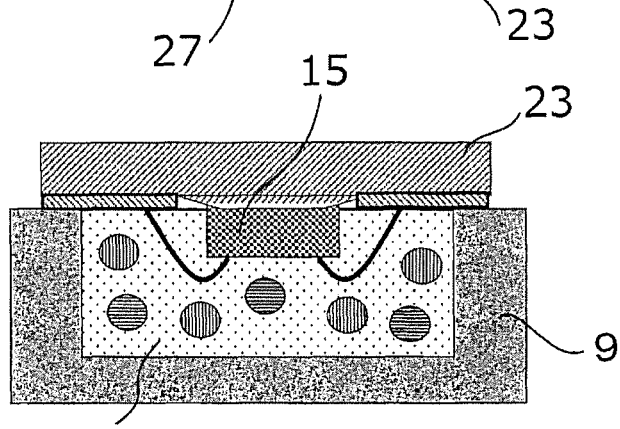
Figure 2D:
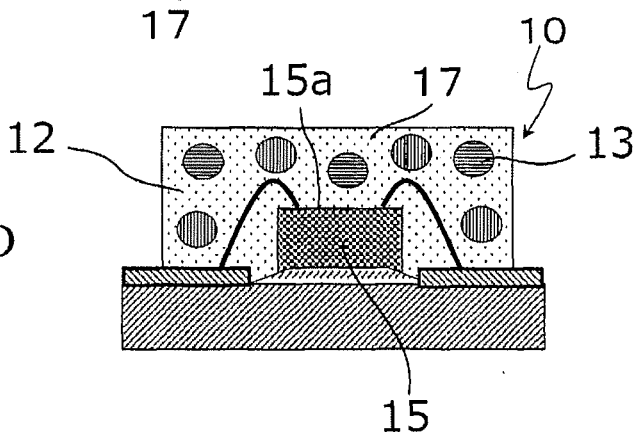

Next, as shown in FIG. 2A, the uncured LED encapsulating resin mixture 17 is poured into a mold 9 of a desired shape. When air bubbles or the like are generated in the uncured LED encapsulating resin mixture 17, the mixture 17 is degassed using a vacuum degassing apparatus or the like, if necessary. As shown in FIG. 2B, the LED chip 15 is fixed to the support 23 with the solder 27 or the like so that the light-emitting surface 15a faces upward, and the electrodes 22 and the LED chip 15 are connected by bonding wires 21. Then, the support 23 is placed on the mold 9 so that the LED chip 15 is embedded in the LED encapsulating resin mixture 17 in the mold 9, and then the LED encapsulating resin mixture 17 is cured. For example, as shown in FIG. 2C, the LED encapsulating resin mixture 17 in the mold 9 is heated and semi-cured, and then the mold 9 is removed and the LED encapsulating resin mixture 17 is further cured. As a result, at least the light-emitting surface 15a of the LED chip 15 is covered by the LED encapsulant 12, and thus the LED device 10 in which the phosphor 13 particles are dispersed in the LED encapsulant 12 is completed.

Third Embodiment

Figure 3:
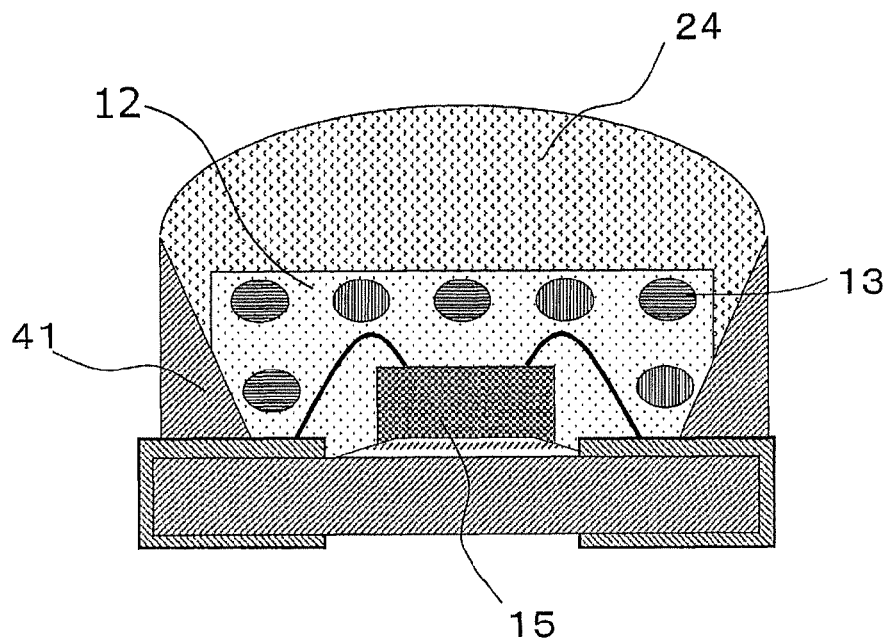
FIG. 3 is a schematic cross-sectional view of an LED device according to a third embodiment of the present disclosure.

The structure of the LED device described in the above embodiment is merely an example. The LED device of the present embodiment may have a structure other than the structure shown in FIG. 1. For example, as shown in FIG. 3, the LED device of the third embodiment includes, in addition to the structure shown in FIG. 1, a reflecting mirror 41 provided around the LED chip 15 to allow the LED device to emit light collected from the LED chip 15 at a given concentration. In addition, a transparent resin 24 serving as a lens for adjusting the concentration of the light to be emitted may be provided on the surface of the LED encapsulant 12.

Fourth Embodiment

Figure 4:
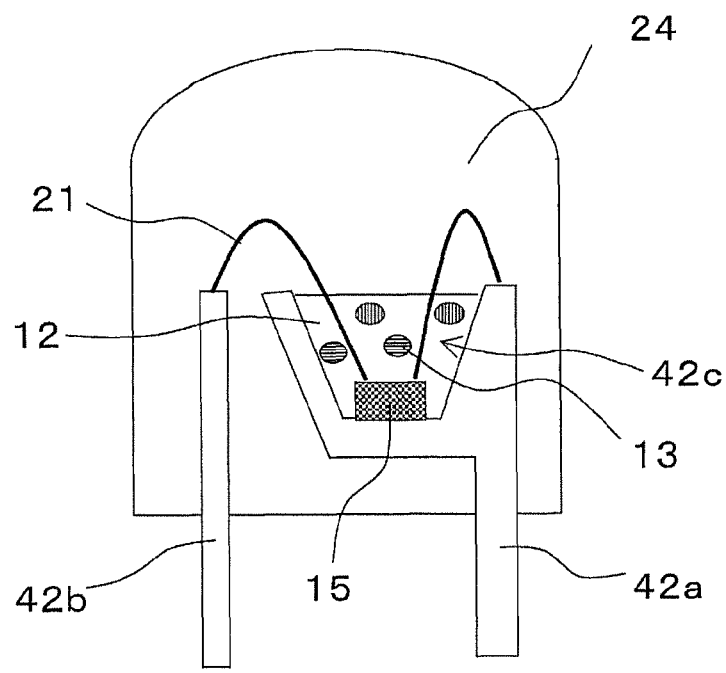
FIG. 4 is a schematic cross-sectional view of an LED device according to a fourth embodiment of the present disclosure.

In the LED device of the second or third embodiment described above, the LED chip 15 is supported on the support in the form of a substrate. However, the LED device of the fourth embodiment is an LED device in which the LED chip is supported in lead frames. Specifically, for example, as shown in FIG. 4, the LED device includes a lead frame 42a serving as a support provided with a recess 42c and a lead frame 42b. The LED chip 15 is fixed to the bottom of the recess 42c of the lead frame 42a. The side surface of the recess 42c serves as a reflecting mirror. The LED encapsulant 12 in which the phosphor 13 particles are dispersed is provided to fill the recess 42c. The LED chip 15 is connected electrically to the lead frames 42a and 42b by the bonding wires 21. Furthermore, the upper part of the LED device including the recess 42c of the lead frame 42a is entirely sealed with the bullet-shaped transparent resin 24.

Fifth Embodiment

Next, as an example of a light-emitting device according to an embodiment of the present disclosure, an LD light-emitting device including a laser diode (LD) as a light-emitting element serving as a light source is described.

Figure 6:
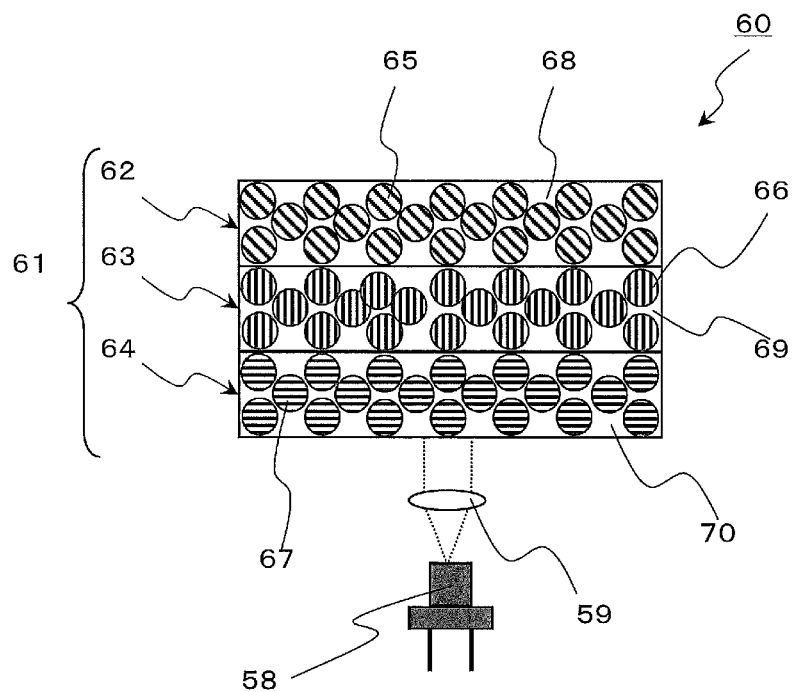
FIG. 6 is an explanatory diagram showing a general configuration of an LD light-emitting device according to a fifth embodiment of the present disclosure.

FIG. 6 shows a schematic configuration of an LD light-emitting device 60 according to the fifth embodiment. The LD light-emitting device 60 includes a wavelength conversion member 61 and an LD element 58.

The LD element 58 can emit light with higher optical energy density than LED. Therefore, the use of the LD element 58 allows the high-power LD light-emitting device 60 to be configured. The optical energy density of light emitted from the LD element 58 is, for example, 0.2 kW/cm$^2$ or more, from the viewpoint of increasing the power of the LD light-emitting device 60. The optical energy density of the emitted light may be 0.3 kW/cm$^2$ or more, 0.5 kW/cm$^2$ or more, or 1 kW/cm$^2$ or more. On the other hand, when the energy density of the emitted light is too high, the amount of heat generated in the phosphor increases, which may adversely affect the LD light-emitting device 60. Therefore, the optical energy density of the emitted light may be 3.5 kW/cm$^2$ or less, 3 kW/cm$^2$ or less, 2.5 kW/cm$^2$ or less, or 2 kW/cm$^2$ or less.

Any LD element that emits light with a wavelength capable of exciting the phosphor of the first embodiment can be used without any limitation. For example, LD elements that emit blue-violet light, LD elements that emit ultraviolet light, etc. can be used.

In the present embodiment, the case where the LD element 58 emits blue-violet light is described. In this specification, the blue-violet light refers to light with a peak wavelength of 380 nm or more and 420 nm or less. The LD element 58 that emits blue-violet light has higher emission efficiency than an LD element that emits ultraviolet light, and when the emission peak wavelength of the LD element 58 is 405 nm, its emission efficiency is highest. Therefore, the emission peak wavelength of the LD element 58 may be 385 nm or more, or 390 nm or more. On the other hand, the emission peak wavelength of the LD element 58 may be 415 nm or less, or 410 nm or less.

The LD element 58 may be composed of a single LD, or composed of a plurality of optically connected LDs. The LD element 58 includes, for example, a light-emitting layer made of a nitride semiconductor having a nonpolar or semipolar growth plane.

The wavelength conversion member 61 includes a phosphor, and the phosphor converts the light emitted from the LD element 58 into light with a longer wavelength. The phosphor in the wavelength conversion member 61 includes the phosphor of the first embodiment. The wavelength conversion member 61 may include phosphors other than the phosphor of the first embodiment to allow the LD light-emitting device to emit desired color light. For example, in the case where the wavelength conversion member 61 further includes a green phosphor and a red phosphor, the LD light-emitting device 60 can be configured as a white light-emitting device. The phosphors shown as examples in the second embodiment can be used as the green phosphor and the red phosphor.

The wavelength conversion member 61 may be a single wavelength conversion layer containing a mixture of two or more different types of phosphors, or may be a stack of at least two wavelength conversion layers each containing a single type or two or more different types of phosphors.

In the present embodiment, in particular, the case where a wavelength conversion member including, as the wavelength conversion member 61, a stack of a first phosphor layer 62 made of the phosphor (blue phosphor) of the first embodiment, a second phosphor layer 63 made of a green phosphor 66, and a third phosphor layer 64 made of a red phosphor 67 is used is described. The first phosphor layer 62, the second phosphor layer 63, and the third phosphor layer 64 contain a binder 68, a binder 69, and a binder 70, respectively. The binders 68, 69, and 70 are, for example, media such as resins, glasses, and transparent crystals. The binders of the respective layers may be made of the same material or different materials. The phosphor layers may each consist of phosphor particles.

An incident optical system 59 that guides light emitted from the LD element 58 to the third phosphor layer 64 may be provided between the wavelength conversion member 61 and the LD element 58. The incident optical system 59 includes, for example, a lens, a mirror, and/or an optical fiber.

Next, the operation of the LD light-emitting device 60 is described. Blue-violet light emitted from the LD element 58 passes through the incident optical system 59 and enters the third phosphor layer 64 of the wavelength conversion member 61. Upon excitation by this incoming light, the red phosphor 67 particles in the third phosphor layer 64 emit red light. A portion of the blue-violet light emitted from the LD element 58 passes through the third phosphor layer without being absorbed therein, and enters the second phosphor layer 63. Upon excitation by this incoming light, the green phosphor 66 particles in the second phosphor layer 63 emit green light. A portion of the blue-violet light emitted from the LD element 58 passes through the second phosphor layer without being absorbed therein, and enters the first phosphor layer 62. Upon excitation by this incoming light, the particles of the blue phosphor 65 of the first embodiment in the first phosphor layer 62 emit blue light. These red light, green light and blue light are mixed together to produce white light.

The thickness of each of the phosphor layers may be adjusted to such a thickness as to prevent the blue-violet light emitted from the LD element 58 from passing through the first phosphor layer 62. Alternatively, it is also possible to adjust the thickness of each phosphor layer to such a thickness as to allow the blue-violet light to pass through the first phosphor layer 62 and to provide an absorption layer or a reflection layer in the LD light-emitting device 60 so as to absorb or reflect the blue-violet light that has passed through the first phosphor layer 62. The light itself emitted from the LD element 58 is not necessarily an essential component of white light. Therefore, such a configuration makes it possible to limit the emission of coherent laser light from the LD element 58 to the outside of the LD light-emitting device 60, and thus to increase the safety of the LD light-emitting device 60.

In another aspect, the positions of the first phosphor layer 62, the second phosphor layer 63, and the third phosphor layer 64 may be changed. A phosphor layer containing the yellow phosphor described in the second embodiment may be used instead of the second phosphor layer 63 and the third phosphor layer 64.

Sixth Embodiment

As the light-emitting device according to an embodiment of the present disclosure, another example of the light-emitting device including an LD as a light-emitting element serving as a light source is described.

Figure 7:
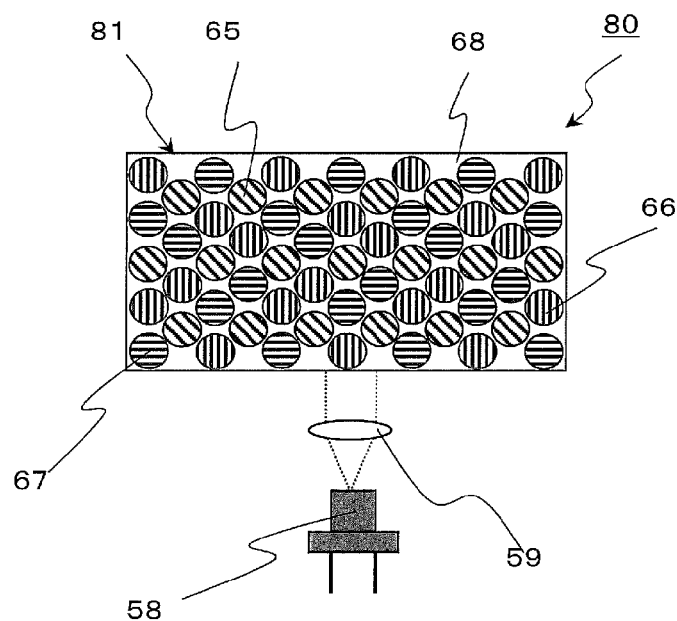
FIG. 7 is an explanatory diagram showing a general configuration of an LD light-emitting device according to a sixth embodiment of the present disclosure.

FIG. 7 shows a schematic configuration of an LD light-emitting device 80 according to the sixth embodiment. The same components as those of the fifth embodiment are designated by the same reference numerals, and the description thereof is omitted. The LD light-emitting device 80 includes a wavelength conversion member 81 and the LD element 58.

The wavelength conversion member 81 includes a phosphor, and the phosphor converts the light emitted from the LD element 58 into light with a longer wavelength. The wavelength conversion member 81 has a wavelength conversion layer containing a mixture of the phosphor of the first embodiment and at least one selected from a green phosphor and a red phosphor. In the present embodiment, in particular, the case where the wavelength conversion member 81 is a phosphor layer containing a mixture of three different types of phosphors: the phosphor (blue phosphor) 65 of the first embodiment; the green phosphor 66; and the red phosphor 67 is described. The mixing ratio of the three types of phosphors can be adjusted as appropriate to obtain a desired degree of whiteness. The phosphor layer as the wavelength conversion member 81 contains the binder 68. The binder 68 is, for example, a medium such as a resin, a glass, or a transparent crystal. The binder may be made of a single material, or the material of the binder may vary from place to place. The phosphor layer may consist of phosphor particles.

Blue-violet light emitted from the LD element 58 passes through the incident optical system 59, and is converted into blue light, green light, and red light by the phosphor 65 of the first embodiment, the green phosphor 66, and the red phosphor 67, respectively, in the wavelength conversion member 81. Then, these blue light, green light, and red light are mixed together to produce white light.

The thickness of the wavelength conversion member 81 may be adjusted to such a thickness as to prevent the blue-violet light emitted from the LD element 58 from passing through the wavelength conversion member 81. Alternatively, it is also possible to adjust the thickness of the wavelength conversion member 81 to such a thickness as to allow the blue-violet light to pass through the wavelength conversion member 81 and to provide an absorption layer or a reflection layer in the LD light-emitting device 80 so as to absorb or reflect the blue-violet light that has passed through the wavelength conversion member 81. Such a configuration makes it possible to increase the safety of the LD light-emitting device 80.

In another aspect, it is also possible to use, instead of the wavelength conversion member 81, a wavelength conversion member having a wavelength conversion layer containing a mixture of the blue phosphor of the first embodiment and the yellow phosphor described in the second embodiment.

According to any of the light-emitting devices of the second to sixth embodiments, it is possible to improve the emission efficiency, and further to configure a white light-emitting device with high color rendering properties and high color reproducibility. In addition, a device including this light-emitting device shows high emission efficiency, and when the device is configured to emit white light, it can exhibit high color rendering properties and high color reproducibility.

For example, the light-emitting devices according to the second to sixth embodiments can be used as light sources for: general-purpose lighting devices such as a ceiling light; special-purpose lighting devices such as a spotlight, a stadium lighting system, and a studio lighting system; vehicle lighting devices such as a headlamp; projection devices such as a projector and a head-up display; endoscope lights; image pickup devices such as a digital camera, a mobile phone, a smart phone; liquid crystal display devices such as a personal computer (PC) monitor, a notebook personal computer, a television, a personal digital assistant (PDA), a smart phone, a tablet PC, and a mobile phone.

Seventh Embodiment

Figure 8:
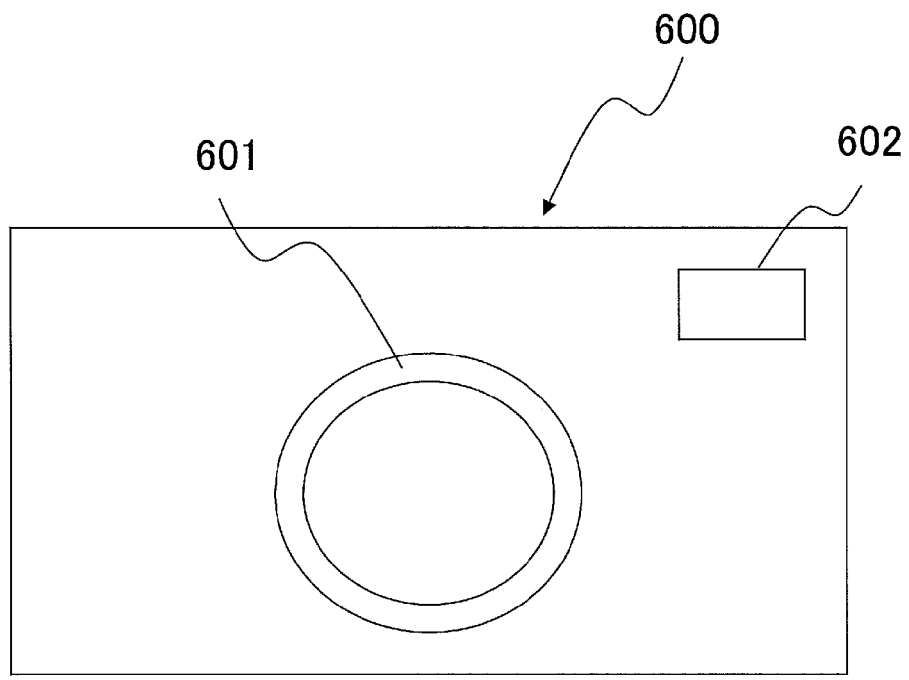
FIG. 8 is an explanatory diagram showing an example of an image pickup device according to a seventh embodiment of the present disclosure.

The light-emitting devices according to the second to sixth embodiments can be used in image pickup devices. FIG. 8 is an explanatory diagram showing an example of an image pickup device according to the seventh embodiment of the present disclosure. An image pickup device 600 according to the seventh embodiment includes a lens 601 and a flashlight 602. The image pickup device 600 is, for example, a digital camera, a mobile phone, a smart phone, or the like. The flashlight 602 includes the above-described LED device 10. The flashlight 602 may include the above-described LD light-emitting device 60 or 80 instead of the LED device 10. Light reflected from an object irradiated with light from the flashlight 602 enters the lens 601. For example, the incident reflected light is photoelectrically converted by an image sensor (not shown) in the image pickup device 600. An electric signal from the image sensor is recorded as image data in a recording device such as a semiconductor memory.

Eighth Embodiment

Figure 9:
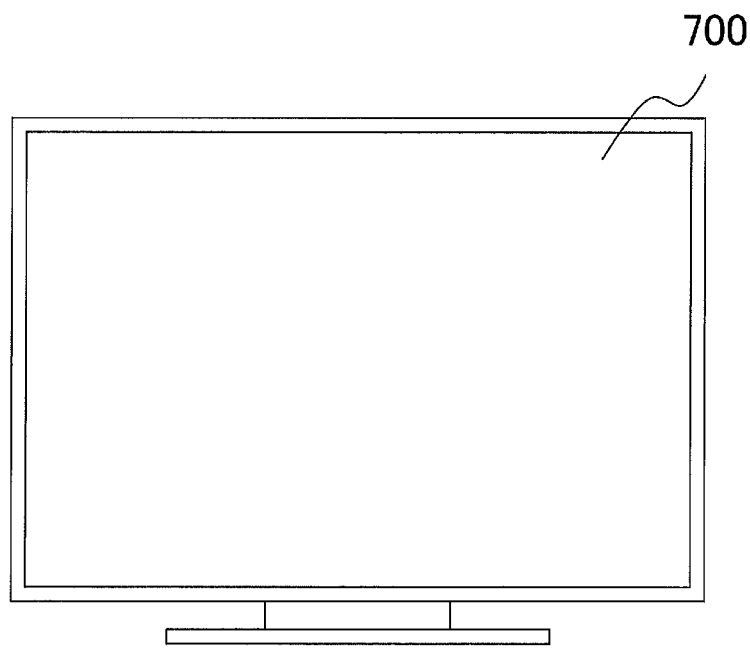
FIG. 9 is a diagram showing an overview of an example of a liquid crystal display device according to an eighth embodiment of the present disclosure.

The LED devices according to the second to fourth embodiments can be used in liquid crystal display devices. FIG. 9 is an overview of a liquid crystal display device 700 according to the eighth embodiment of the present disclosure. The liquid crystal display device 700 is, for example, a personal computer (PC) monitor, a notebook personal computer, a television, a personal digital assistant (PDA), a smart phone, a tablet PC, or a mobile phone.

Figure 10:
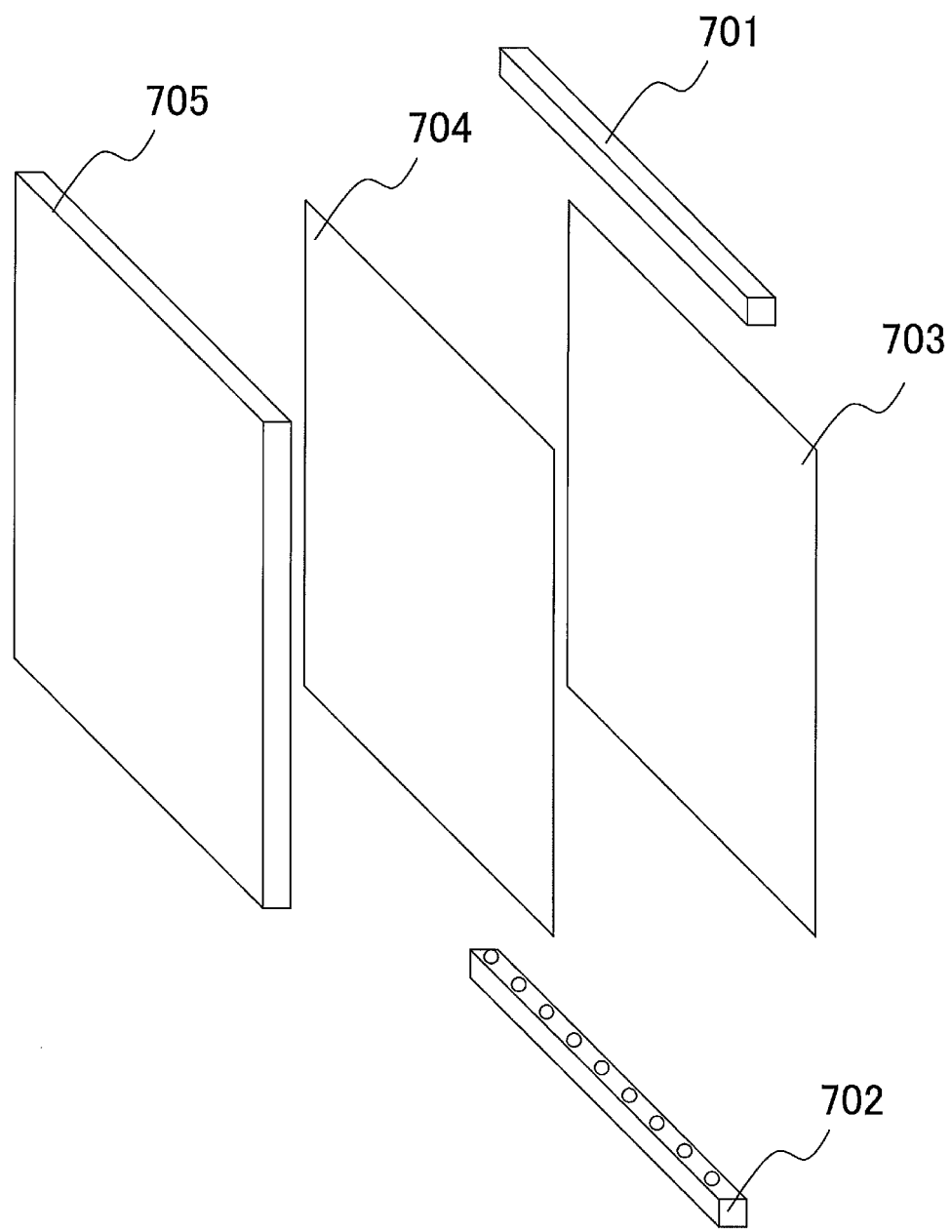
FIG. 10 is an explanatory diagram showing an example of a configuration of a liquid crystal display device.

FIG. 10 is an explanatory diagram showing a configuration of the liquid crystal display device 700. The liquid crystal display device 700 may be of an edge light type or a direct backlight type, or may be configured in other ways. Here, an edge light type liquid crystal display device is described as an example. The liquid crystal display device 700 includes, for example, backlights 701 and 702 each including a plurality of LED devices 10, a reflecting plate 703 that reflects light from the backlights, a light guide plate 704 that guides light reflected from the reflecting plate 703, and a liquid crystal panel 705 that displays images using the light from the light guide plate 704. The backlights 701 and 702 may each include the above-described LD light-emitting device 60 or 80 instead of the LED devices 10.

Ninth Embodiment

The light-emitting devices according to the second to sixth embodiments can be used in lighting devices. The lighting devices are, for example, general-purpose lighting devices such as a ceiling light; special-purpose lighting devices such as a spotlight, a stadium lighting system, and a studio lighting system; and vehicle lighting devices such as a headlamp and a DRL (Daytime Running Lamp).

The ninth embodiment is an example of the lighting device of the present disclosure as a general-purpose lighting device.

Figure 11:
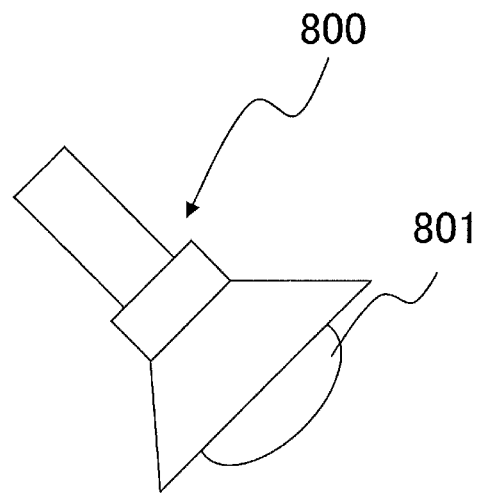
FIG. 11 is an explanatory diagram showing an example of a general-purpose lighting device according to a ninth embodiment of the present disclosure.

FIG. 11 is an explanatory diagram showing a ceiling light 800 as an example of a general-purpose lighting device according to the ninth embodiment. The ceiling light 800 includes a light source portion 801. The light source portion 801 includes the above-described LED device 10. The light source portion 801 may include the above-described LD light-emitting device 60 or 80 instead of the LED device 10. According to the configuration of the present embodiment, it is possible to provide a high quality illuminated space suitable for the intended use.

Tenth Embodiment

The tenth embodiment is an example of the lighting device of the present disclosure configured as a vehicle lighting device. In this specification, vehicles refer to automobiles, railway vehicles, streetcars, two-wheel vehicles (such as motorcycles), and special-purpose vehicles (such as construction vehicles and agricultural vehicles)

Figure 12:
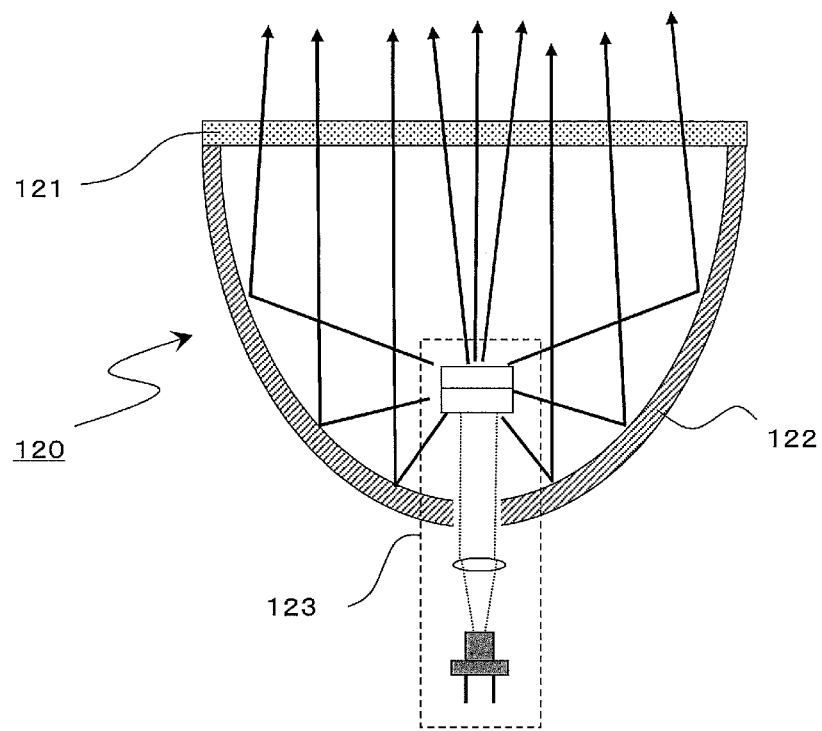
FIG. 12 is an explanatory diagram showing an example of a vehicle lighting device according to a tenth embodiment of the present disclosure.

FIG. 12 shows a schematic configuration of a vehicle headlamp 120 as an example of a vehicle lighting device according to the tenth embodiment. The vehicle headlamp 120 includes a light source portion 123 including the LD light-emitting device 60 or 80, and a projecting optical system 122 that projects light forward from the light source portion 123. In this example, the LD light-emitting device 60 or 80 is used as the light source portion 123 because of its high power, but the above-described LED device 10 may be used instead.

A wavelength cutoff filter 121 that absorbs or reflects blue-violet light/ultraviolet light may be provided to prevent leakage of the blue-violet light/ultraviolet light emitted from the LD element of the LD light-emitting device 60 or 80 outside the vehicle headlamp 120. The projecting optical system 122 is, for example, a reflector. The projecting optical system 122 has, for example, a film of a metal such as Al or Ag, or an Al film having a protective film formed thereon. The vehicle headlamp 120 may be a so-called reflector-type headlamp or projector-type headlamp.

According to the tenth embodiment, it is possible to provide a vehicle lighting device with high emission efficiency.

Eleventh Embodiment

The eleventh embodiment is a vehicle including the vehicle lighting device according to the tenth embodiment. The vehicle may be an engine-driven vehicle, an electric vehicle, or a hybrid vehicle.

Figure 13:
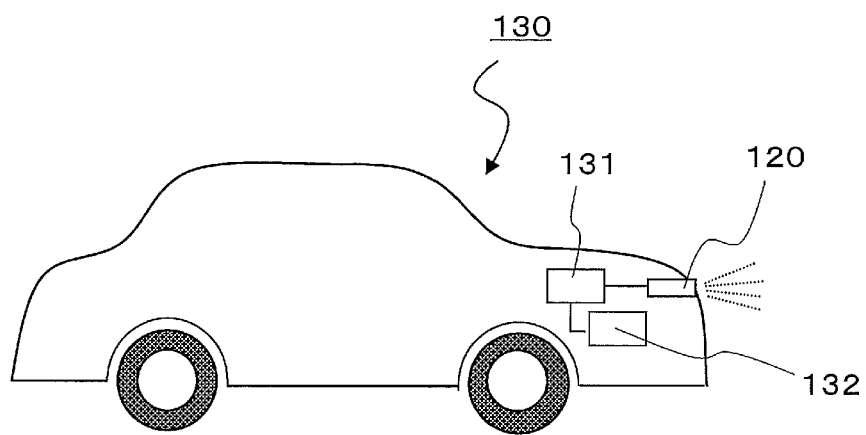
FIG. 13 is an explanatory diagram showing an example of a vehicle according to an eleventh embodiment of the present disclosure.

FIG. 13 shows a schematic configuration of a vehicle 130 according to the eleventh embodiment. The vehicle 130 includes the vehicle headlamp 120 described as an example of the tenth embodiment and an electric power source 131. The vehicle 130 may have a power generator 132 that is rotationally driven by a driving source such as an engine to generate electric power. The electric power generated by the power generator 132 is stored in the electric power source 131. The electric power source 131 is a rechargeable secondary battery. The vehicle headlight 120 lights up when electric power is supplied from the electric power source 131.

According to the eleventh embodiment, it is possible to provide a vehicle including a lamp tool with high emission efficiency.

EXAMPLES

Hereinafter, the present disclosure is described in detail with reference to Examples and Comparative Examples. However, the present disclosure is not limited to these Examples.

Example 1 and Comparative Example 1

Preparation of Phosphor Samples

A method for preparing phosphors is shown below. For each of the samples except for Sample No. 2, $BaCO_3$, $SrCO_3$, $MgO$, $SiO_2$, and $Eu_2O_3$ were used as starting materials. These materials were weighed according to the compositions shown in Table 2, and mixed at a rotational speed of 200 rpm for 30 minutes in a planetary ball mill. Ethanol was used as a solvent. These mixture solutions were each dried sufficiently and the resulting dry powder was fired at 1300° C. for 4 hours in a mixed gas of 2% $H_2$ and 98% $N_2$. Thus, phosphors represented by the general formula $(Ba_{1-z-x},Sr_z,Eu_x)_{3+j}Mg_{1+k}Si_{2+m}O_{8+n}$ were obtained. As for Sample No. 2, a phosphor was prepared by a method disclosed in JP 2009-280793 A.

<Evaluation Method>

The X-ray diffraction pattern of each of the phosphors obtained as described above was measured with an X-ray diffractometer (RINT 2100, Rigaku, Co., Ltd.). Measurement was performed with Cu-Kα radiation under the conditions shown in Table 1. An X-ray diffraction intensity ratio "a" (a=c/b) was obtained from the X-ray diffraction pattern thus obtained. The X-ray diffraction intensity ratio "a" is a ratio of the diffraction intensity "c" of the main peak of the $BaMgSiO_4$ based crystal detected at 2θ=34° or more and 35.5° or less to the diffraction intensity "b" of the main peak of the $Ba_3MgSi_2O_8$ based crystal detected at 2θ=31.8° or more and 32.8° or less. The emission spectrum at 405 nm excitation was measured with a spectrofluorometer (FP-6500, JASCO Corporation). The number of photons was calculated from the emission spectrum thus obtained.

TABLE 1

| Start angle | End angle | Sampling interval | Scanning speed | Tube voltage | Tube current | Divergence slit | Scattering slit | Receiving slit |
|---|---|---|---|---|---|---|---|---|
| 20.00° | 60.00° | 0.02° | 4.00°/min | 40 kV | 40 mA | 1° | 1° | 0.15 mm |

Figure 14:
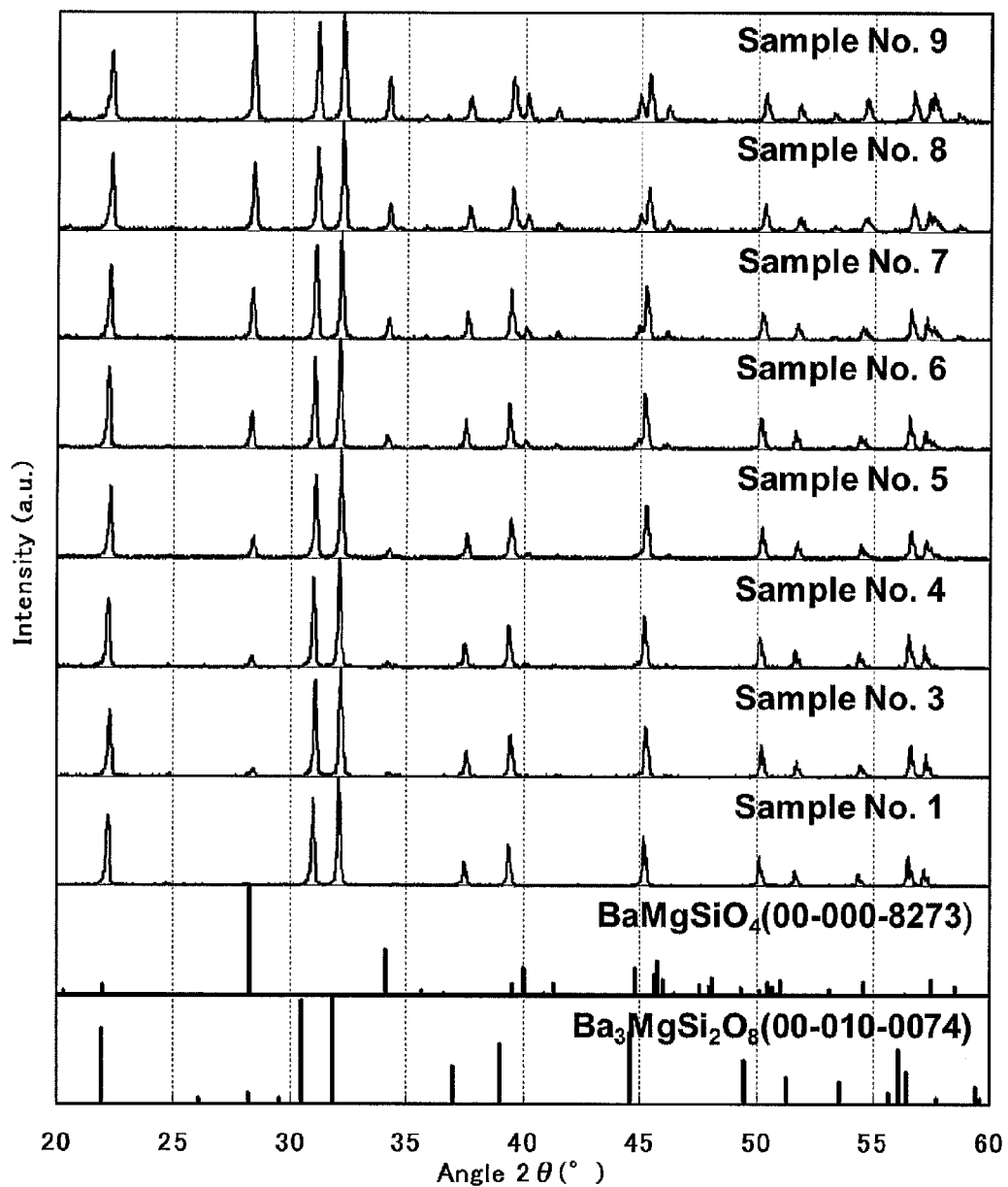
FIG. 14 shows XRD diffraction patterns of phosphor samples of Example 1 and Comparative Example 1 as well as pattern data of $BaMgSiO_4$ and $Ba_3MgSi_2O_8$ from JCPDS cards.
Figure 15A:
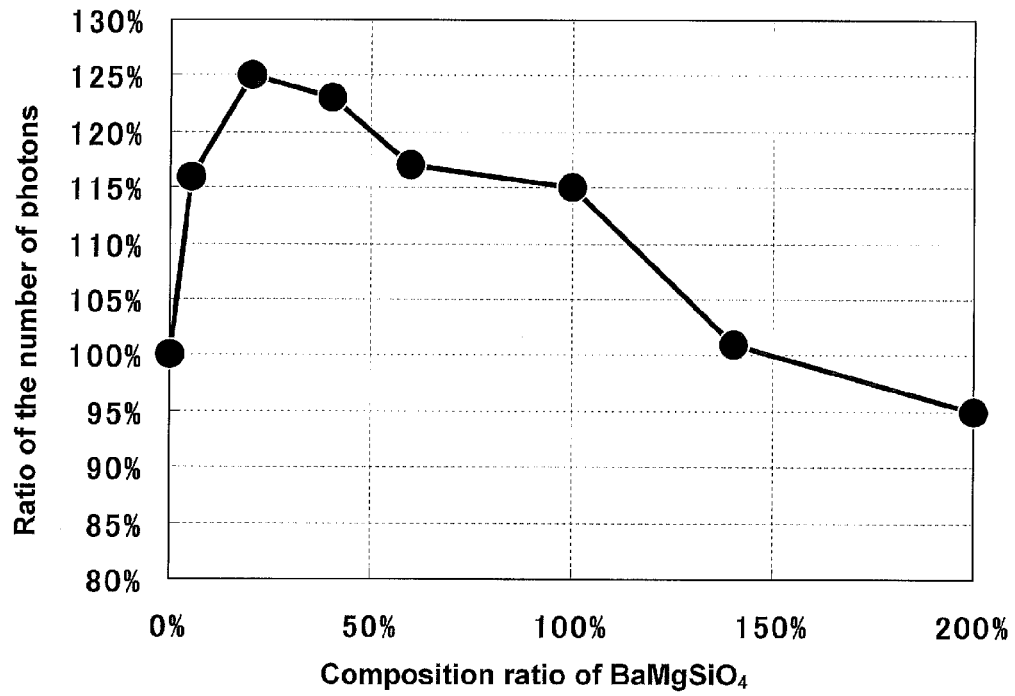
FIG. 15A is a graph showing a relationship between the composition ratio of $BaMgSiO_4$ to the total amount of $BaMgSiO_4$ and $Ba_3MgSi_2O_8$ and the ratio of the number of emitted photons in each of the samples shown in FIG. 14 and Table 2.
Figure 15B:
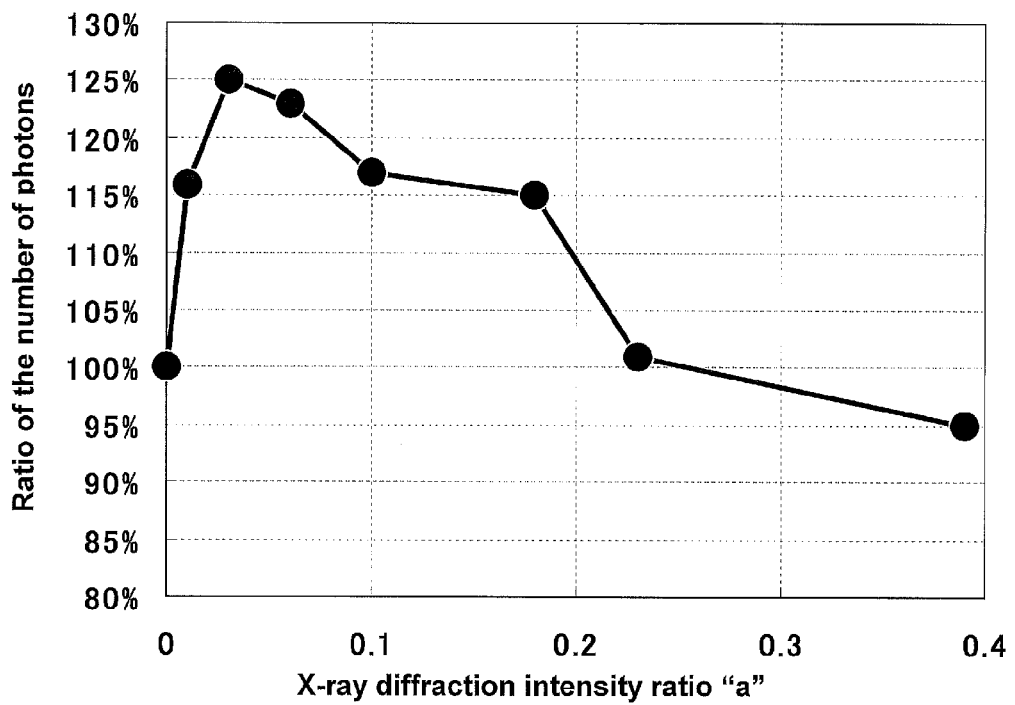
FIG. 15B is a graph showing a relationship between the X-ray diffraction intensity ratio "a" and the ratio of the number of emitted photons in each of the samples shown in FIG. 14 and Table 2.

FIG. 14 shows the X-ray diffraction patterns of the obtained phosphors. For reference, FIG. 14 also shows the pattern data of $BaMgSiO_4$ and $Ba_3MgSi_2O_8$ from JCPDS cards. Furthermore, Table 2 shows the X-ray diffraction intensity ratios "a" and the ratios of the number of photons. FIG. 15A shows a graph showing a relationship between the composition ratio of $BaMgSiO_4$ to the total amount of $BaMgSiO_4$ and $Ba_3MgSi_2O_8$ and the ratio of the number of emitted photons in the samples shown in FIG. 14 and Table 2. FIG. 15B shows a graph showing a relationship between the X-ray diffraction intensity ratio "a" and the ratio of the number of emitted photons in the samples shown in FIG. 14 and Table 2. In Table 2, the samples marked with asterisks (*) are those of Comparative Example.

TABLE 2

| Sample No. | \multicolumn{6}{c}{Composition formula} | | | | | | X-ray diffraction intensity ratio "a" | Ratio of the number of photons (%) | Ratio of the number of photons per unit volume (%) |
|---|---|---|---|---|---|---|---|---|---|
| | j | k | m | n | z | x | | | |
| *1 | 0 | 0 | 0 | 0 | 0.15 | 0.03 | 0.00 | 100% | 100% |
| *2 | — | — | — | — | — | — | 0.00 | 105% | 105% |
| 3 | 0.05 | 0.05 | 0.05 | 0.2 | 0.15 | 0.03 | 0.01 | 116% | 122% |
| 4 | 0.2 | 0.2 | 0.2 | 0.8 | 0.15 | 0.03 | 0.03 | 125% | 150% |
| 5 | 0.4 | 0.4 | 0.4 | 1.6 | 0.15 | 0.03 | 0.06 | 123% | 172% |
| 6 | 0.6 | 0.6 | 0.6 | 2.4 | 0.15 | 0.03 | 0.10 | 117% | 187% |
| 7 | 1.0 | 1.0 | 1.0 | 4.0 | 0.15 | 0.03 | 0.18 | 115% | 230% |
| 8 | 1.4 | 1.4 | 1.4 | 5.6 | 0.15 | 0.03 | 0.23 | 101% | 242% |
| 9 | 2.0 | 2.0 | 2.0 | 8.0 | 0.15 | 0.03 | 0.39 | 95% | 285% |
| 10 | 1.0 | 1.0 | 0.8 | 3.6 | 0.15 | 0.03 | 0.08 | 115% | 230% |
| 11 | 1.0 | 1.0 | 0.92 | 3.84 | 0.15 | 0.03 | 0.10 | 118% | 236% |
| 12 | 1.0 | 1.0 | 1.12 | 4.24 | 0.15 | 0.03 | 0.10 | 121% | 242% |

It is seen from FIG. 14 that each particle of the phosphors of Sample Nos. 3 to 12 is composed of a mixed crystal of $Ba_3MgSi_2O_8$ and $BaMgSiO_4$. Therefore, presumably, the horizontal axis in FIG. 15A represents the average ratio of the number of moles of $BaMgSiO_4$ to the total number of moles of the constituent materials in each particle of the phosphors.

A single-phase phosphor represented by $BaMgSiO_4$ was prepared, and the resulting phosphor did not emit light. Nevertheless, Table 2 reveals that the number of photons emitted from each of the phosphors composed of a mixed crystal of $Ba_3MgSi_2O_8$ and $BaMgSiO_4$, except for the phosphors of Sample Nos. 8 and 9, is larger than that in the conventional phosphors (Sample Nos. 1 and 2).

Here, the ratio of the number of photons of each sample shown in Table 2 is the value in the sample including non-emitting $BaMgSiO_4$:Eu, which means that the phosphor having a higher content of the $BaMgSiO_4$ crystal has a smaller emitting volume therein. So, the volume ratio between $Ba_3MgSi_2O_8$ and $BaMgSiO_4$ was calculated, and the ratio of the number of photons actually emitted from $Ba_3MgSi_2O_8$:Eu per unit volume is also shown in Table 2. This reveals that all the phosphors of Sample Nos. 3 to 12 including Sample Nos. 8 and 9, each composed of a mixed crystal of $Ba_3MgSi_2O_8$ and $BaMgSiO_4$, have larger number of photons emitted from $Ba_3MgSi_2O_8$:Eu than that in the conventional phosphors, when compared with that in the phosphor of Sample No. 1 composed of a single crystal of $Ba_3MgSi_2O_8$.

In terms of the quantum efficiency of the entire phosphor, the phosphor is very useful when the X-ray diffraction intensity ratio "a" is $0.01 \leq a \leq 0.18$. The phosphor is more useful when the X-ray diffraction intensity ratio "a" is $0.03 \leq a \leq 0.06$. On the other hand, the phosphor is very useful when the host crystal of the phosphor has a composition represented by the general formula $Ba_{3+j}Mg_{1+k}Si_{2+m}O_{8+n}$ (where j, k, m and n satisfy $0 < j \leq 1.0$, $0 < k \leq 1.0$, $0 < m \leq 1.0$, and $0 < n < 4.0$).

Example 2 and Comparative Example 2

Preparation of Phosphor Samples

A method for preparing phosphors is shown below. $BaCO_3$, $SrCO_3$, MgO, $SiO_2$, and $Eu_2O_3$ were used as starting materials. These materials were weighed according to the compositions shown in Table 3 to Table 7, and mixed at a rotational speed of 200 rpm for 30 minutes in a planetary ball mill. Ethanol was used as a solvent. These mixture solutions were each dried sufficiently and the resulting dry powder was fired at 1300° C. for 4 hours in a mixed gas of 2% $H_2$ and 98% $N_2$. Thus, phosphors represented by the general formula $(Ba_{1-z-x},Sr_z,Eu_x)_{3+j}Mg_{1+k}Si_{2+m}O_{8+n}$ were obtained. Table 3 to Table 7 show the X-ray diffraction intensity ratios "a" and the ratios of the number of photons of the phosphors thus obtained. In Table 3 to Table 7, the samples marked with asterisks (*) are those of Comparative Example.

TABLE 3

| Sample No. | \multicolumn{6}{c}{Composition formula} | | | | | | X-ray diffraction intensity ratio "a" | Ratio of the number of photons (%) |
|---|---|---|---|---|---|---|---|---|
| | j | k | m | n | z | x | | |
| *13 | 0 | 0 | 0 | 0 | 0 | 0.03 | 0.00 | 100% |
| 14 | 0.2 | 0.2 | 0.2 | 0.8 | 0 | 0.03 | 0.03 | 110% |

TABLE 4

| Sample No. | \multicolumn{6}{c}{Composition formula} | | | | | | X-ray diffraction intensity ratio "a" | Ratio of the number of photons (%) |
|---|---|---|---|---|---|---|---|---|
| | j | k | m | n | z | x | | |
| *15 | 0 | 0 | 0 | 0 | 0.15 | 0.03 | 0.00 | 100% |
| 16 | 0.2 | 0.2 | 0.2 | 0.8 | 0.15 | 0.03 | 0.03 | 125% |

TABLE 5

| Sample No. | \multicolumn{6}{c}{Composition formula} | | | | | | X-ray diffraction intensity ratio "a" | Ratio of the number of photons (%) |
|---|---|---|---|---|---|---|---|---|
| | j | k | m | n | z | x | | |
| *17 | 0 | 0 | 0 | 0 | 0.30 | 0.03 | 0.00 | 100% |
| 18 | 0.2 | 0.2 | 0.2 | 0.8 | 0.30 | 0.03 | 0.02 | 109% |

TABLE 6

| Sample No. | Composition formula | | | | | | X-ray diffraction intensity ratio "a" | Ratio of the number of photons (%) |
|---|---|---|---|---|---|---|---|---|
| | j | k | m | n | z | x | | |
| *19 | 0 | 0 | 0 | 0 | 0.40 | 0.03 | 0.00 | 100% |
| 20 | 0.2 | 0.2 | 0.2 | 0.8 | 0.40 | 0.03 | 0.02 | 121% |

TABLE 7

| Sample No. | 14 | 16 | 18 | 20 |
|---|---|---|---|---|
| Ratio of the number of photons to that of Sample No. 14 | 100% | 118% | 102% | 102% |

As is evident from Table 3 to Table 7, a mixed crystal of $(Ba_{1-z},Sr_z)_3MgSi_2O_8$ and $(Ba_{1-z},Sr_z)MgSiO_4$ obtained by partial substitution of Ba by Sr has an increased number of photons when the Sr substitution concentration is in a range of $0 \leq z \leq 0.4$.

Example 3 and Comparative Example 3

Preparation of Phosphor Samples

A method for preparing phosphors is shown below. $BaCO_3$, $SrCO_3$, $MgO$, $SiO_2$, and $Eu_2O_3$ were used as starting materials. These materials were weighed according to the compositions shown in Table 8, and mixed at a rotational speed of 200 rpm for 30 minutes in a planetary ball mill. Ethanol was used as a solvent. These mixture solutions were each dried sufficiently and the resulting dry powder was fired at 1300° C. for 4 hours in a mixed gas of 2% $H_2$ and 98% $N_2$. Thus, phosphors represented by the general formula $(Ba_{1-z-x},Sr_z,Eu_x)_{3+j}Mg_{1+k}Si_{2+m}O_{8+n}$ were obtained. In Table 8, the samples marked with asterisks (*) are those of Comparative Example.

<Evaluation of Emission Characteristics of Phosphors>

Each of the phosphors thus obtained was irradiated with light using a laser diode having a peak wavelength of 405 nm as an excitation light source. The light emitted from the phosphor was introduced into an integrating sphere, and the emission wavelength and the emission energy were measured with a multi-channel spectrometer (USB 2000, Labsphere Ocean Optics, Inc.). The energy density of the excitation light was changed by changing the irradiation area of the laser diode. Table 9 shows the relative emission intensities as measured when the energy densities of the excitation light were 0.01 kW/cm² and 0.5 kW/cm². In Table 9, the samples marked with asterisks (*) are those of Comparative Example.

TABLE 8

| Sample No. | Composition formula | | | | | |
|---|---|---|---|---|---|---|
| | j | k | m | n | z | x |
| *21 | 0 | 0 | 0 | 0 | 0.05 | 0.03 |
| *22 | 0 | 0 | 0 | 0 | 0.05 | 0.024 |
| *23 | 0 | 0 | 0 | 0 | 0.05 | 0.02 |
| *24 | 0 | 0 | 0 | 0 | 0.05 | 0.016 |
| *25 | 0 | 0 | 0 | 0 | 0.05 | 0.01 |
| *26 | 0 | 0 | 0 | 0 | 0.05 | 0.006 |
| 27 | 0.2 | 0.2 | 0.2 | 0.8 | 0.05 | 0.03 |
| 28 | 0.2 | 0.2 | 0.2 | 0.8 | 0.05 | 0.024 |
| 29 | 0.2 | 0.2 | 0.2 | 0.8 | 0.05 | 0.02 |
| 30 | 0.2 | 0.2 | 0.2 | 0.8 | 0.05 | 0.016 |
| 31 | 0.2 | 0.2 | 0.2 | 0.8 | 0.05 | 0.01 |
| 32 | 0.2 | 0.2 | 0.2 | 0.8 | 0.05 | 0.006 |
| 33 | 0.4 | 0.4 | 0.4 | 1.6 | 0.05 | 0.03 |
| 34 | 0.4 | 0.4 | 0.4 | 1.6 | 0.05 | 0.024 |
| 35 | 0.4 | 0.4 | 0.4 | 1.6 | 0.05 | 0.02 |
| 36 | 0.4 | 0.4 | 0.4 | 1.6 | 0.05 | 0.016 |
| 37 | 0.4 | 0.4 | 0.4 | 1.6 | 0.05 | 0.01 |
| 38 | 0.4 | 0.4 | 0.4 | 1.6 | 0.05 | 0.006 |

TABLE 9

| Sample No. | X-ray diffraction intensity ratio "a" | Ratio of the number of photons at 0.01 kW/cm² | Ratio of the number of photons at 0.5 kW/cm² |
|---|---|---|---|
| *21 | 0 | 100% | 100% |
| *22 | 0 | 98% | 101% |
| *23 | 0 | 96% | 108% |
| *24 | 0 | 91% | 111% |
| *25 | 0 | 89% | 110% |
| *26 | 0 | 78% | 106% |
| 27 | 0.03 | 115% | 115% |
| 28 | 0.03 | 109% | 118% |
| 29 | 0.03 | 104% | 130% |
| 30 | 0.03 | 99% | 137% |
| 31 | 0.03 | 91% | 136% |
| 32 | 0.03 | 84% | 118% |
| 33 | 0.06 | 113% | 113% |
| 34 | 0.07 | 107% | 117% |
| 35 | 0.06 | 103% | 129% |
| 36 | 0.06 | 95% | 135% |
| 37 | 0.05 | 90% | 132% |
| 38 | 0.06 | 80% | 113% |

As is evident from Table 9, in the case where the energy density of the excitation light is 0.01 kW/cm², the number of photons increases as the Eu substitution ratio x increases. When the x is in a range of x>0.02, the number of photons is particularly large. On the other hand, it is revealed that in the case where the energy density of the excitation light is 0.5 kW/cm², the number of photons is particularly large when the Eu substitution ratio x is x≥0.006, and the largest number of photons is obtained in the range of x<0.02.

Example 4 and Comparative Example 4

Fabrication of LED Devices

White LEDs were fabricated using the phosphors of Samples Nos. 1, 2 and 4. A method for fabricating white LEDs is shown below.

(Fabrication of White LED 1 Using Phosphor of Sample No. 1)

5 g of an agent A of dimethyl silicone resin (KER-2600, Shin-Etsu Chemical Co., Ltd.), 5 g of an agent B of dimethyl silicone resin (KER-2600, Shin-Etsu Chemical Co., Ltd.), 2.00 g of the phosphor of Sample No. 1, 1.43 g of a commercially available β-SiAlON green phosphor, and 1.57 g of a commercially available CASN red phosphor were passed through a three-roll mill (M50, EXAKT) five times. Thus, an uncured LED encapsulating resin mixture was obtained. Then, after degassing this uncured LED encapsulating resin mixture in a vacuum degassing apparatus (from Nichiden Anelva Corporation) for 5 minutes, the resulting mixture was placed on an LED chip having a peak wavelength of 405 nm and cured at 150° C. for 30 minutes. Thus, an LED device as shown in FIG. 1 was completed.

(Fabrication of White LED 2 Using Phosphor of Sample No. 2)

5 g of an agent A of dimethyl silicone resin (KER-2600, Shin-Etsu Chemical Co., Ltd.), 5 g of an agent B of dimethyl silicone resin (KER-2600, Shin-Etsu Chemical Co., Ltd.), 1.85 g of the phosphor of Sample No. 2, 1.50 g of a commercially available β-SiAlON green phosphor, and 1.65 g of a commercially available CASN red phosphor were passed through a three-roll mill (M50, EXAKT) five times. Thus, an uncured LED encapsulating resin mixture was obtained. Then, after degassing this uncured LED encapsulating resin mixture in a vacuum degassing apparatus (from Nichiden Anelva Corporation) for 5 minutes, the resulting mixture was placed on an LED chip having a peak wavelength of 405 nm and cured at 150° C. for 30 minutes. Thus, an LED device as shown in FIG. 1 was completed.

(Fabrication of White LED 3 Using Phosphor of Sample No. 4)

5 g of an agent A of dimethyl silicone resin (KER-2600, Shin-Etsu Chemical Co., Ltd.), 5 g of an agent B of dimethyl silicone resin (KER-2600, Shin-Etsu Chemical Co., Ltd.), 1.50 g of the phosphor of Sample No. 4, 1.74 g of a commercially available β-SiAlON green phosphor, and 1.76 g of a commercially available CASN red phosphor were passed through a three-roll mill (M50, EXAKT) five times. Thus, an uncured LED encapsulating resin mixture was obtained. Then, after degassing this uncured LED encapsulating resin mixture in a vacuum degassing apparatus (from Nichiden Anelva Corporation) for 5 minutes, the resulting mixture was placed on an LED chip having a peak wavelength of 405 nm and cured at 150° C. for 30 minutes. Thus, an LED device as shown in FIG. 1 was completed.

<Evaluation Method>

The CIE chromaticity coordinates and luminances of the white LEDs 1 to 3 obtained as described above were measured with a photometer/colorimeter (from Hamamatsu Photonics K.K.). Table 10 shows the CIE chromaticity coordinate values and relative luminance values. In Table 10, the samples marked with asterisks (*) are those of Comparative Example.

TABLE 10

| White LED | Sample No. of phosphor | CIE x | CIE y | Luminance ratio (%) |
|---|---|---|---|---|
| *1 | *1 | 0.345 | 0.350 | 100% |
| *2 | *2 | 0.345 | 0.350 | 102% |
| 3 | 4 | 0.345 | 0.350 | 114% |

As is evident from Table 10, it was confirmed that the white LED fabricated using the phosphor of the present embodiment has improved luminance.

The present disclosure may be embodied in other forms without departing from the spirit or essential characteristics thereof. The embodiments disclosed in this specification are to be considered in all respects as illustrative and not limiting. The scope of the present disclosure is indicated by the appended claims rather than by the foregoing description, and all changes which come within the meaning and range of equivalency of the claims are intended to be embraced therein.

INDUSTRIAL APPLICABILITY

A combined use of the phosphor of the present disclosure and a light-emitting element allows a light-emitting device to be configured. This light-emitting device can be used in general-purpose lighting devices such as a ceiling light; special-purpose lighting devices such as a spotlight, a stadium lighting system, and a studio lighting system; vehicle lighting devices such as a headlamp; projection devices such as a projector and a head-up display; endoscope lights; image pickup devices such as a digital camera, a mobile phone, a smart phone; and liquid crystal display devices such as a personal computer (PC) monitor, a notebook personal computer, a television, a personal digital assistant (PDA), a smart phone, a tablet PC, and a mobile phone.

What is claimed is:

1. A phosphor for emitting blue light, comprising: a $(Ba_{1-z},Sr_z)_3MgSi_2O_8$ based crystal where z satisfies $0 \leq z < 1$ and a $(Ba_{1-z},Sr_z)MgSiO_4$ based crystal where z satisfies $0 \leq z < 1$ as a host crystal; and $Eu^{2+}$ as a luminescent center.

2. The phosphor according to claim 1, wherein in an X-ray diffraction pattern of the phosphor measured with Cu-Kα radiation, the phosphor has diffraction peaks at $2\theta=22°$ or more and 23° or less, at $2\theta=30.6°$ or more and 31.7° or less, and at $2\theta=31.8°$ or more and 32.8° or less, and diffraction peaks at $2\theta=28°$ or more and 30.4° or less and at $2\theta=34°$ or more and 35.5° or less.

3. The phosphor according to claim 1, wherein in an X-ray diffraction pattern of the phosphor measured with Cu-Kα radiation, a ratio "a" satisfies a=c/b and $0.01 \leq a < 0.18$, the ratio "a" being a ratio of an intensity "c" to an intensity "b", wherein
the intensity "c" is a highest diffraction peak intensity in a range of $2\theta=34°$ or more and 35.5° or less derived from the $(Ba_{1-z},Sr_z)MgSiO_4$ based crystal, and
the intensity "b" is a highest diffraction peak intensity in a range of $2\theta=31.8°$ or more and 32.8° or less derived from the $(Ba_{1-z},Sr_z)_3MgSi_2O_8$ based crystal.

4. The phosphor according to claim 1, wherein the host crystal of the phosphor has a composition represented by the general formula: $(Ba_{1-z},Sr_z)_{3+j}Mg_{1+k}Si_{2+m}O_{8+n}$ where j, k, m, n and z satisfy $0<j \leq 1.0$, $0<k \leq 1.0$, $0<m \leq 1.0$, $0<n \leq 4.0$, and $0 \leq z \leq 0.4$.

5. The phosphor according to claim 1, wherein the phosphor has a Eu content of less than 2.0 at. % of a total of Eu, Ba, and Sr.

6. The phosphor according to claim 1, wherein the phosphor has a Eu content of 0.6 at. % or more of a total of Eu, Ba, and Sr.

7. A light-emitting device comprising:
the phosphor according to claim 1; and
a semiconductor diode based light-emitting element which emits light in a range of 380-420 nm.

8. The light-emitting device according to claim 7, wherein the light-emitting element is a laser diode.

9. The light-emitting device according to claim 8, wherein the laser diode has a laser energy density of 0.5 kW/cm² or more.

10. The light-emitting device according to claim 7, wherein the light-emitting element comprises a light-emitting layer made of a nitride semiconductor having a nonpolar or semipolar growth plane.

11. An image pickup device comprising:
a flashlight comprising the light-emitting device according to claim 7; and
a lens on which light reflected from an object irradiated with light from the flashlight is incident.

12. A liquid crystal display device comprising a backlight comprising the light-emitting device according to claim 7.

13. A lighting device comprising a light source portion comprising the light-emitting device according to claim 7.

14. The lighting device according to claim 13, wherein the lighting device is a vehicle lighting device.

15. A vehicle comprising the vehicle lighting device according to claim 14.

16. The phosphor according to claim 1, wherein the host crystal of the phosphor has a composition represented by the general formula: $(Ba_{1-z},Sr_z)_{3+j}Mg_{1+k}Si_{2+m}O_{8+n}$ where j, k, m, n and z satisfy $0<j\le1.0$, $0<k\le1.0$, $0<m\le1.0$, $0<n\le4.0$, and $0<z\le0.4$.

* * * * *